US010289005B2

(12) United States Patent
Lee

(10) Patent No.: US 10,289,005 B2
(45) Date of Patent: May 14, 2019

(54) UNIT FOR SUPPLYING LIQUID, APPARATUS FOR TREATING A SUBSTRATE, AND METHOD FOR TREATING A SUBSTRATE

(71) Applicant: SEMES CO., LTD., Cheonan-si, Chungcheongnam-do (KR)

(72) Inventor: Seunghan Lee, Cheonan-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 0 days.

(21) Appl. No.: 15/952,402

(22) Filed: Apr. 13, 2018

(65) Prior Publication Data

US 2018/0314158 A1    Nov. 1, 2018

(30) Foreign Application Priority Data

Apr. 28, 2017   (KR) .................... 10-2017-0055400

(51) Int. Cl.
*G03D 5/00* (2006.01)
*G03F 7/30* (2006.01)
*B05C 5/00* (2006.01)
*G03F 7/40* (2006.01)
(Continued)

(52) U.S. Cl.
CPC ............ *G03F 7/30* (2013.01); *B05C 5/005* (2013.01); *G03F 7/16* (2013.01); *G03F 7/3021* (2013.01); *G03F 7/38* (2013.01); *G03F 7/40* (2013.01)

(58) Field of Classification Search
USPC ........................................... 396/611
See application file for complete search history.

(56) References Cited

U.S. PATENT DOCUMENTS 5,678,116 A * 10/1997 Sugimoto ............ G03F 7/3021
396/611
7,823,534 B2 * 11/2010 Ookouchi ............ G03F 7/3021
118/313
(Continued)

FOREIGN PATENT DOCUMENTS

KR    2003-0059046 A    7/2003
KR      100629918 B1    9/2006
(Continued)

*Primary Examiner* — Rodney E Fuller
(74) *Attorney, Agent, or Firm* — Harness, Dickey & Pierce, P.L.C.

(57) ABSTRACT

An apparatus and a method for performing liquid treatment with respect to a substrate are provided. The apparatus includes a substrate supporting unit that supports and rotates the substrate, and a liquid supplying unit that supplies a liquid onto the substrate supported by the substrate supporting unit. The liquid supplying unit includes a nozzle unit that supplies a first treatment liquid and a second treatment liquid, and a moving unit that moves the nozzle unit. The nozzle unit has a first slit discharge port for discharging the first treatment liquid in a liquid curtain manner, a second slit discharge port for discharging the second treatment liquid in the liquid curtain manner, and a wetting liquid discharge port for discharging a pre-wetting liquid. The treatment liquids are selectively supplied depending on films formed on the substrate, thereby easily coping with the substrate having various types of films.

18 Claims, 16 Drawing Sheets

(51) Int. Cl.
*G03F 7/38* (2006.01)
*G03F 7/16* (2006.01)

(56) References Cited

U.S. PATENT DOCUMENTS

| | | | | |
|---|---|---|---|---|
| 7,896,562 | B2* | 3/2011 | Yamamoto | H01L 21/6715 118/52 |
| 8,393,808 | B2* | 3/2013 | Yamamoto | G03F 7/3021 396/611 |
| 8,678,684 | B2* | 3/2014 | Yamamoto | G03F 7/3021 396/611 |
| 2009/0103960 | A1* | 4/2009 | Harumoto | G03F 7/2041 399/377 |
| 2009/0214985 | A1* | 8/2009 | Kulp | G03F 7/40 430/322 |
| 2009/0311632 | A1* | 12/2009 | Takeguchi | G03F 7/3021 430/322 |
| 2016/0026086 | A1* | 1/2016 | Fukuda | G03F 7/30 355/27 |

FOREIGN PATENT DOCUMENTS

| | | |
|---|---|---|
| KR | 101617650 B1 | 5/2016 |
| KR | 20160108653 A | 9/2016 |

\* cited by examiner

UNIT FOR SUPPLYING LIQUID, APPARATUS FOR TREATING A SUBSTRATE, AND METHOD FOR TREATING A SUBSTRATE

CROSS-REFERENCE TO RELATED APPLICATIONS

This application claims priority under 35 U.S.C. § 119 to Korean Patent Application No. 10-2017-0055400 filed on Apr. 28, 2017, in the Korean Intellectual Property Office, the disclosures of which are incorporated by reference herein in their entireties.

BACKGROUND

Embodiments of the inventive concept described herein relate to apparatuses and methods for performing liquid treatment with respect to substrates.

To fabricate a semiconductor device and a flat display panel, various processes, such as a photolithography, etching, ashing, thin film deposition, and rinsing processes. In the case of the photolithography process among them, coating, exposing, and developing steps are sequentially performed. The coating process is to coat a sensitizing solution such as a resist. The exposing process is to expose a circuit pattern on the substrate having a photoresist film to light. The developing process is to selectively develop the region of the substrate subject to the exposing process.

In general, the developing process may include a developing solution supplying step, a rinse solution supplying step, and a drying step. Among them, the developing solution supplying step is a step of supplying a developing solution to the substrate, and the developing solution is secondarily supplied to the substrate to adjust a developing solution film to be thicker. The developing solution is primarily supplied in a steam manner and secondarily supplied in a liquid curtain manner.

According to the stream manner, the developing solution is supplied on the center of the substrate. According to the liquid curtain manner, the developing solution is supplied while a region, to which a developing solution is discharged, is being moved. Accordingly, in the developing solution supplying step, two nozzles are necessary for supplying the same developing solution. To additionally perform the rinse liquid supplying step and the drying step, two or more nozzles are at least necessary.

The nozzles used in the developing process may include a developing solution nozzle, a rinse liquid nozzle, and a dry nozzle. The internal space of a developing processing device becomes narrower and the number of the nozzles may not be increased. As well, when nozzles are excessively increased, the device may be frequently broken.

The developing solution used in the developing process may include various types of developing solutions depending on films on the substrate. The developing solutions are used to develop the substrate through the same process. Accordingly, if the developing solutions are supplied in one developing processing device, various types of films may be developed.

However, since the number of the nozzles may not be increased as described above, developing processing devices have to be distinguished therebetween depending on the type of developing solutions.

As a prior art, there is disclosed Korean Unexamined Patent Publication No. 2005-0100521.

SUMMARY

Embodiments of the inventive concept provide apparatuses and methods for improving the efficiency of a space having nozzles in a liquid treatment device.

Embodiments of the inventive concept provide apparatuses and methods for supplying various types of liquids by using the limited number of nozzle units.

According to an embodiment of the inventive concept, there is provided an apparatus and a method for performing liquid treatment with respect to a substrate. The apparatus includes a substrate supporting unit that supports and rotates the substrate, and a liquid feeding unit that feeds a liquid onto the substrate supported by the substrate supporting unit. The liquid feeding unit includes a nozzle unit that supplies a first treatment liquid and a second treatment liquid, and a moving unit that moves the nozzle unit. The nozzle unit has a first slit discharge port for discharging the first treatment liquid in a liquid curtain manner, a second slit discharge port for discharging the second treatment liquid in the liquid curtain manner, and a wetting liquid discharge port for discharging a pre-wetting liquid.

The first slit discharge port and the second slit discharge port are provided to have length directions parallel to a first direction, respectively. The nozzle u nit includes a main body having the wetting liquid discharge port, a first body coupled to one side of the main body and having the first slit discharge port, and a second body coupled to another side of the main body and having the second slit discharge port. The first body, the main body, and the second body may be sequentially arranged in a second direction perpendicular to the first direction. The first slit discharge port and the second slit discharge port may be provided to be inclined downward in a direction of facing the main body. The first slit discharge port and the second slit discharge port may be formed to be offset from each other about a line passing through the wetting liquid discharge port while extending in the second direction.

The main body may further have a first circular discharge port for discharging the first treatment liquid in the steam manner and a second circular discharge port for discharging the second treatment liquid in the stream manner. The first circular discharge port, the wetting liquid discharge port, and the second circular discharge port may be sequentially arranged in the first direction. The first slit discharge port may be formed at a position of facing the first circular discharge port in the second direction, and the second slit discharge port may be formed at a position of facing the second circular discharge port in the second direction.

In addition, the first slit discharge port and the second slit discharge port may be provided to be inclined downward in directions of facing each other.

The apparatus may further include a controller that controls the liquid supplying unit such that the nozzle unit moves in the first direction. The controller may move the nozzle unit between the central region of the substrate and an edge region of the substrate, based on a position in which a discharge region of the liquid overlaps with a line, which passes through the center of the substrate while extending in the first direction, when viewed from a top. A discharging direction of the first treatment liquid and a discharging direction of the second treatment liquid may be provided to face a downstream side of a rotation direction of the substrate, when viewed from the top.

The controller controls the liquid supplying unit such that a line passing through the center of the substrate while extending in the second direction is positioned between a first discharge region of the first treatment liquid and a second discharge region of the second treatment liquid, when viewed from the top.

A liquid feeding unit, which supplies a liquid onto a substrate, includes a nozzle unit that supplies a first treatment liquid and a second treatment liquid, and a moving unit that moves the nozzle unit. The nozzle unit has a first slit discharge port for discharging the first treatment liquid in a liquid curtain manner, a second slit discharge port for discharging the second treatment liquid in the liquid curtain manner, and a wetting liquid discharge port for discharging a pre-wetting liquid.

The nozzle unit may include a main body having the wetting liquid discharge port, a first body coupled to the main body and having the first slit discharge port, and a second body coupled to the main body and having the second slit discharge port. The first slit discharge port and the second slit discharge port may be provided to have lengthwise directions parallel to the first direction. The first slit discharge port and the second slit discharge port may be provided to face in a downward-inclined direction such that lower portions of the first slit discharge port and the second slit discharge port are closer to the main body.

A first body may be coupled to one side of the main body and the second body may be coupled to another side of the main body. The one side of the main body and the another body of the main body may be provided as opposite sides in the second direction perpendicular to the first direction. The first slit discharge port and the second slit discharge port may be formed to be offset from each other about a line passing through the wetting liquid discharge port while extending in the second direction.

The main body may further have a first circular discharge port for discharging the first treatment liquid in the steam manner and a second circular discharge port for discharging the second treatment liquid in the stream manner. The first circular discharge port, the wetting liquid discharge port, and the second circular discharge port may be sequentially arranged in the first direction. The first slit discharge port may be formed at a position of facing the first circular discharge port in the second direction. The second slit discharge port may be formed at a position of facing the second circular discharge port in the second direction.

A method for performing liquid treatment with respect to a substrate by using the apparatus includes performing a first liquid treatment process of supplying the first treatment liquid onto a first substrate placed on the substrate support unit, and performing a second liquid treatment process of supplying the second treatment liquid onto a second substrate placed on the substrate support unit. A moving direction of the first slit discharge port in the first liquid treatment process is opposite to a moving direction of the second slit discharge port in the second liquid treatment process.

The first liquid treatment process may include a first stream supplying step of supplying the first treatment liquid, which is discharged in the stream manner, to the center of the first substrate and a first liquid curtain supplying step of supplying the first treatment liquid discharged in the liquid curtain manner to a first discharge region. The second liquid treatment process may include a second stream supplying step of supplying the second treatment liquid, which is discharged in the stream manner, to the center of the second substrate, and a second liquid-curtain supplying step of supplying the second treatment liquid, which is discharged in the liquid curtain manner, to a second discharge region. The first discharge region and the second discharge region may be changed from central regions of respective substrates to edge regions of the respective substrates.

The first discharge region may include a region between the central region of a substrate and the region of the substrate, and the second discharge region may include a region opposite to the first discharge region about the center of a substrate.

The first treatment liquid and the second treatment liquid may include mutually different types of developing solutions.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, embodiments of the inventive concept will be described in more detail with reference to the accompanying drawings. The embodiments of the inventive concept may be modified in various forms, and the scope of the inventive concept should not be construed to be limited to the following embodiments The embodiments of the inventive concept are provided to describe the inventive concept for those skilled in the art more completely. Accordingly, the shapes of the components of the drawings are exaggerated to emphasize clearer description thereof.

The facility of the present embodiment of the inventive concept may be used to perform a photolithography process on a substrate such as a semiconductor substrate or a flat display panel. In particular, the facility of the present embodiment may be connected to an exposing device to perform a developing process with respect to the substrate. However, the present embodiment is not limited, but various processes may be applied as long as the substrate is subject to the liquid treatment. In addition, according to the present embodiment, a wafer serves as the substrate by way of example, Hereinafter, a substrate treating facility according to the inventive concept will be described with reference to FIGS. 1 to 16.

Figure 1:
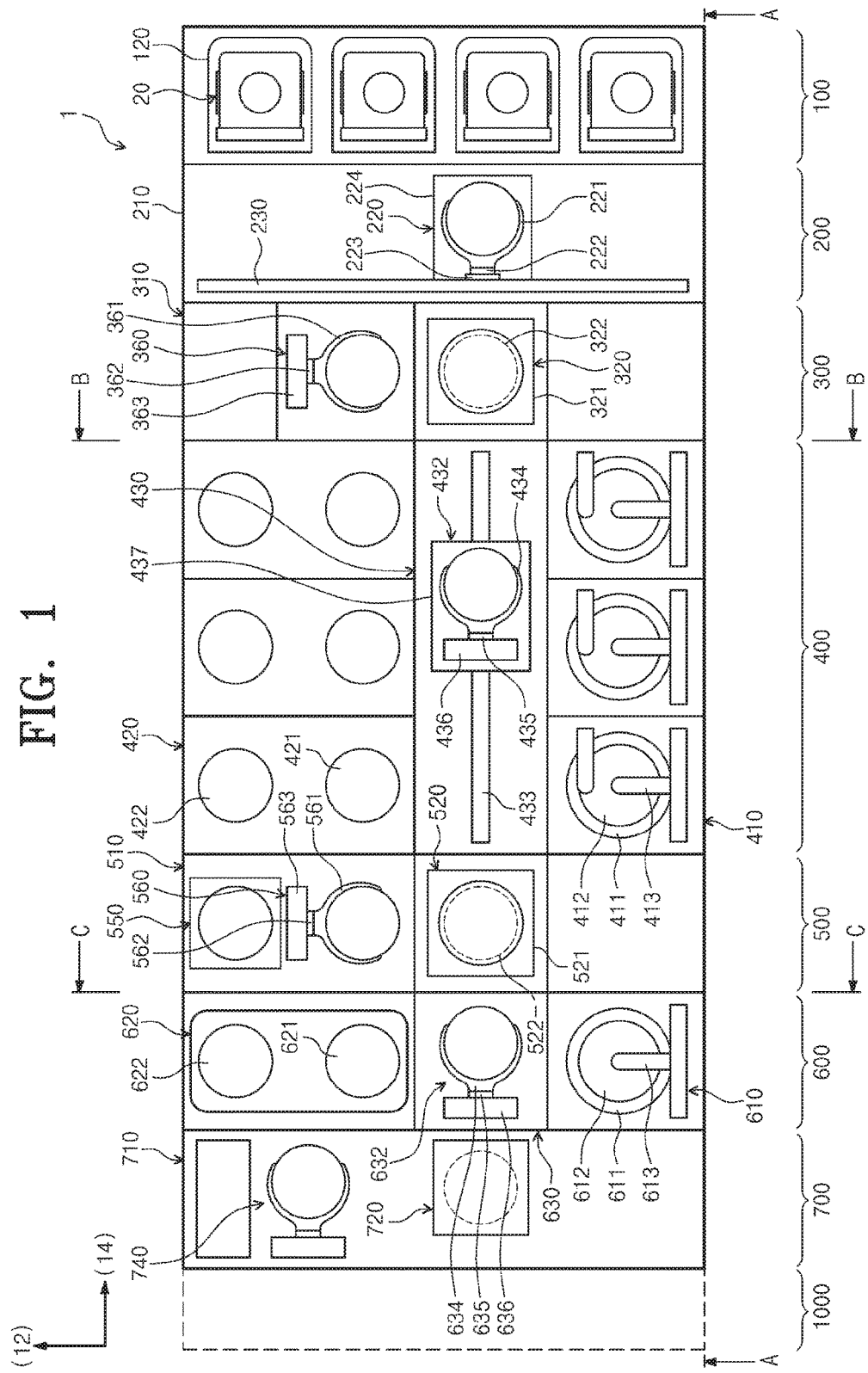
FIG. 1 is a plan view of a substrate treating facility according to an embodiment of the inventive concept.
Figure 2:
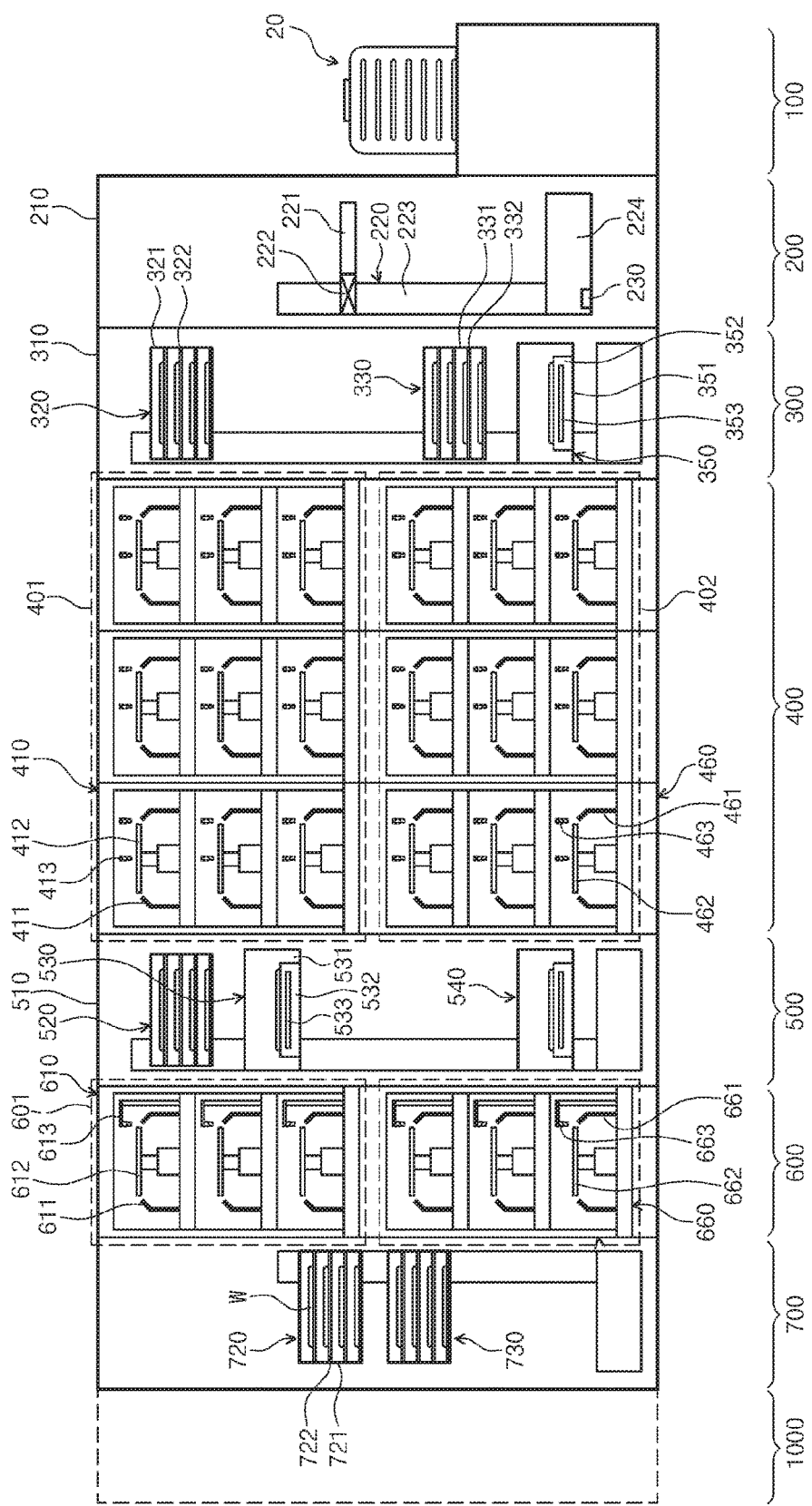
FIG. 2 is a sectional view of the facility of FIG. 1 which is taken along line A-A of FIG. 1.
Figure 3:
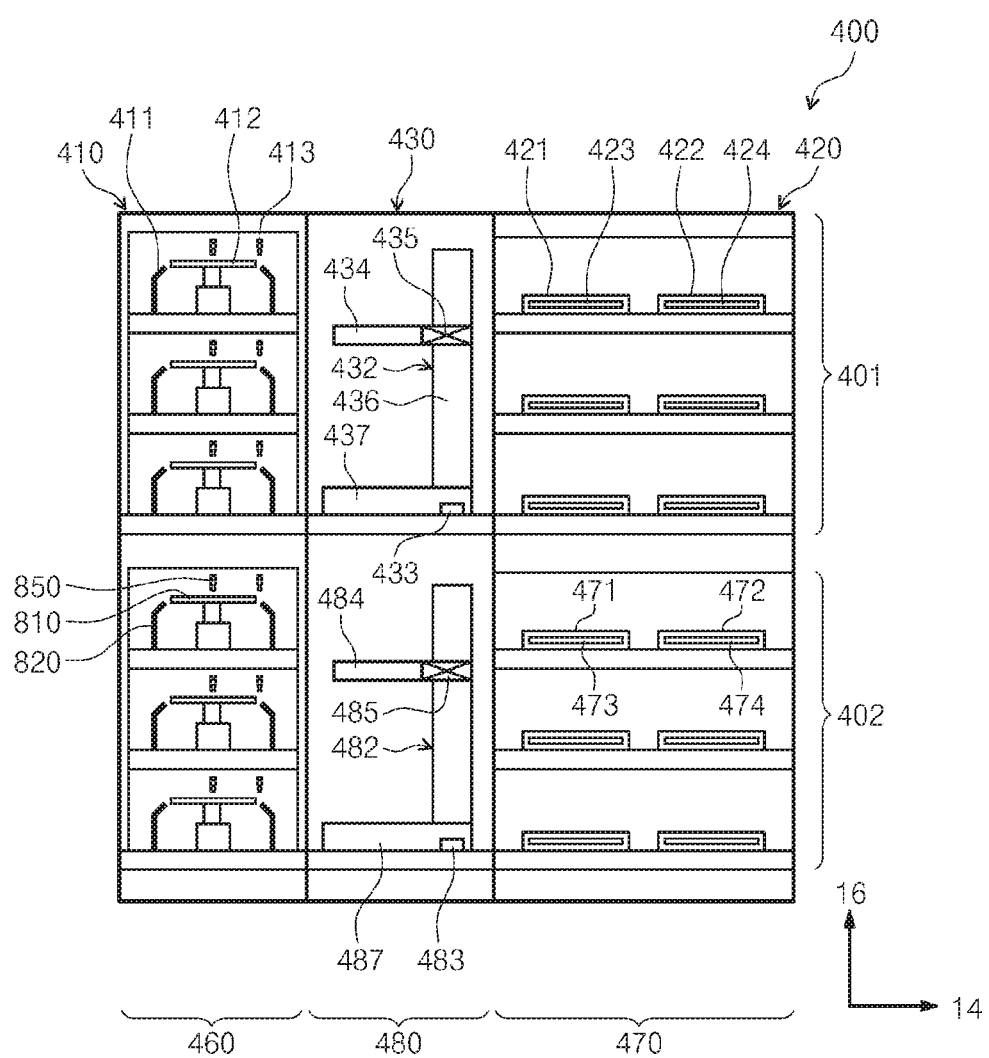
FIG. 3 is a sectional view of the facility of FIG. 1 which is taken along line B-B of FIG. 1.
Figure 4:
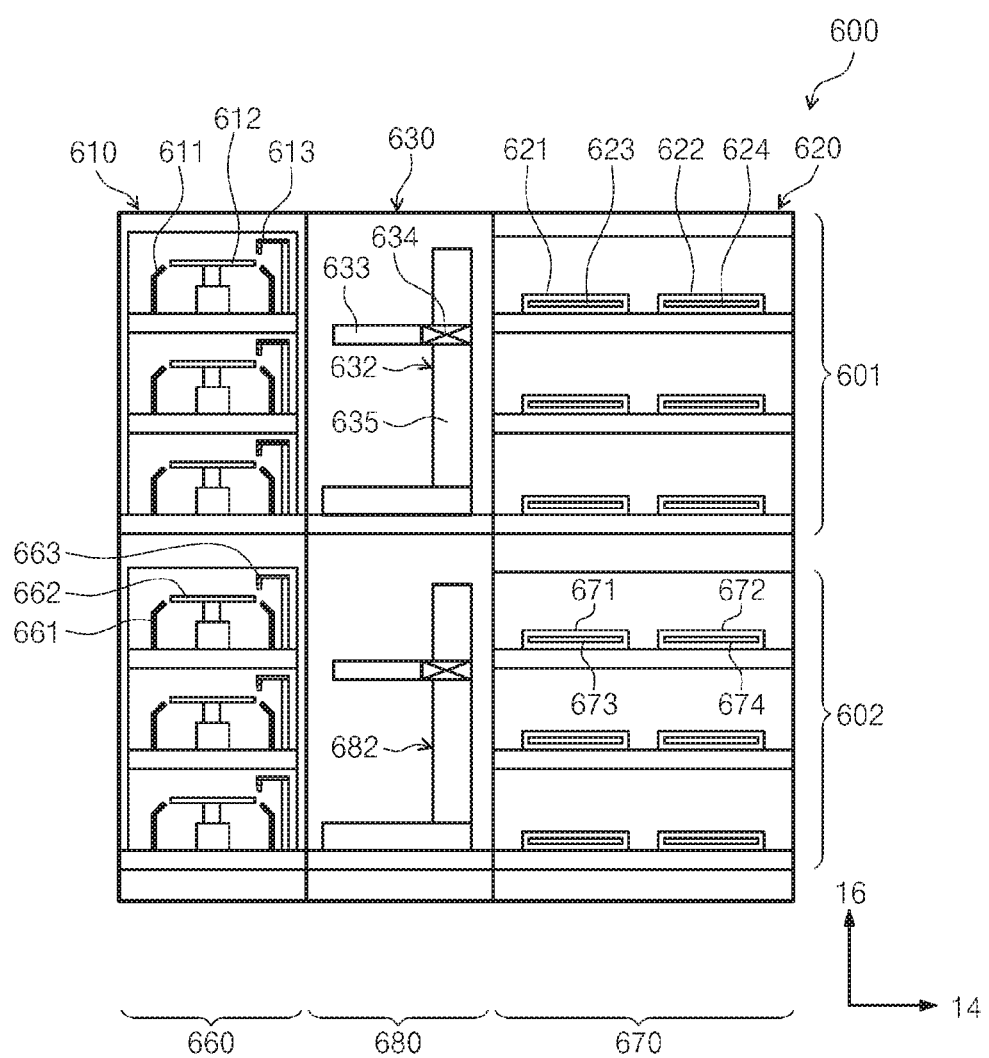
FIG. 4 is a sectional view of the facility of FIG. 1 which is taken along line C-C of FIG. 1.

FIG. 1 is a plan view of a substrate treating facility according to an embodiment of the inventive concept, FIG. 2 is a sectional view of the facility of FIG. 1 which is taken along line A-A of FIG. 1, FIG. 3 is a sectional view of the facility of FIG. 1 which is taken along line B-B of FIG. 1, and FIG. 4 is a sectional view of the facility of FIG. 1 which is taken along line C-C of FIG. 1;

Referring to FIGS. 1 to 4, the substrate treating facility 1 includes a load port 100, an index module 200, a first buffer module 300, a coating/developing module 400, a second buffer module 500, a pre/post-exposure treating module 600, and an interface module 700. The load port 100, the index module 200, the first buffer module 300, the coating/developing module 400, the second buffer module 500, the pre/post-exposure treating module 600, and the interface module 700 are sequentially disposed in a row in one direction.

Hereinafter, a direction in which the load port 100, the index module 200, the first buffer module 300, the coating/developing module 400, the second buffer module 500, the pre/post-exposure treating module 600, and the interface module 700 are arranged will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate "W" is moved while being received in a cassette 20. In this case, the cassette 20 has a structure that is sealed from the outside. For example, a front open unified pod (FOUP) that has a door on the front side may be used as the cassette 20.

Hereinafter, the load port 100, the index module 200, the first buffer module 300, the coating/developing module 400, the second buffer module 500, the pre/post-exposure treating module 600, and the interface module 700 will be described in detail.

The load port 100 has a carrier 120 on which the cassette 20 having the substrates "W" received therein is placed. A plurality of carriers 120 are provided, and are disposed along the second direction 14 in a row. In FIG. 2, four carriers 120 are provided.

The index module 200 transfers the substrate "W" between the cassette 20 placed on the carrier 120 of the load port 100 and the first buffer module 300. The index module 200 has a frame 210, an index robot 220, and a guide rail 230. The frame 210 has a substantially rectangular parallelepiped shape having a hollowed structure, and is interposed between the load part 100 and the first buffer module 300. The frame 210 of the index module 200 may be provided at a height lower than that of a frame 310 of the first buffer module 300, which will be described below. The index robot 220 and the guide rail 230 are disposed in the frame 210. The index robot 220 has a four-axis driven structure allowing a hand 221 thereof directly handling the substrate "W" to be movable and rotatable in the first direction 12, the second direction 14, and the third direction 16. The index robot 220 has a hand 221, an arm 222, a support 223, and a prop 224. The hand 221 is fixedly installed in the arm 222. The arm 222 has an extensible and rotatable structure. The length of the support 223 extends in the third direction 16. The arm 222 is coupled to the support 223 movably along the support 223. The support 223 is fixedly coupled to the prop 224. The length of the guide rail 230 extends in the second direction 14. The prop 224 is coupled to the guide rail 230 to be linearly movable along the guide rail 230. Although not illustrated, the frame 210 further includes a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having a hollow structure, and is interposed between the index module 200 and the coating/developing module 400. The first buffer 320, the second buffer 330, the cooling chamber 350, and the first buffer robot 360 are situated within the frame 310. The cooling chamber 350, the second buffer 330, and the first buffer 320 are arranged in the third direction 16 sequentially from the bottom The first buffer 320 is positioned at a height corresponding to an application module 401 of the coating/developing module 400, which will be described below, and the second buffer 330 and the cooling chamber 350 are situated at a height corresponding to a developing module 402 of the coating/developing module 400, which will be described below The first buffer robot 360 is spaced apart from the second buffer 330, the cooling chamber 350, and the first buffer 320 by a specific distance in the second direction 14.

The first buffer 320 and the second buffer 330 temporarily store a plurality of substrates W. The second buffer 330 has a housing 331 and a plurality of supports 332. The supports 332 are disposed inside the housing 331, and are spaced apart from each other along the third direction 16. One substrate "W" is placed on each of the supports 332 The housing 331 has openings (not illustrated) in directions of providing the index robot 220, the first buffer robot 360, and a development robot 482 of the development module 402 to be described such that the index robot 220, the first buffer robot 360, and the development robot 482 introduce or withdraw the substrate "W" into or out of the support 332 provided inside the housing 331. The first buffer 320 has a structure substantially similar to that of the second buffer 330. Meanwhile, the housing 321 of the first buffer 320 has openings in directions of providing the first buffer robot 360 and a coating robot 432 situated in the coating module 401 to be described. The number of supports 322 provided in the first buffer 320 may be equal to or different from the number of supports 332 provided in the second buffer 330. According to an embodiment, the number of the supports 332 provided in the second buffer 330 may be larger than the number of the supports 332 provided in the first buffer 320

The first buffer robot 360 transfers the substrate "W" between the first buffer 320 and the second buffer 330. The first buffer robot 360 has a hand 361, an arm 362, and a support 363. The hand 361 is fixedly installed in the arm 362. The arm 362 has an extensible structure such that the hand 361 is movable in the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downward. The first buffer robot 360 may be provided such that the hand 361 is simply two-axis driven along the second direction 14 and the third direction 16.

The cooling chamber 350 cools a substrate "W" The cooling chamber 350 has a housing 351 and a cooling plate 352 The cooling plate 352 has a cooling unit 353 that cools an upper surface thereof on which a substrate "W" is positioned and the substrate W. Various types such as a cooling type using cooling water and a cooling type using a thermoelectric element may be used as the cooling unit 353. A lift pin assembly (not illustrated) may be provided in the cooling chamber 350 to locate the substrate "W" on the cooling plate 352. The housing 351 has openings (not illustrated) in directions of providing the index robot 220 and the development robot 482 provided in the development module 402 to be described such that the index robot 220 and the development robot 482 introduce or withdraw the substrate "W" into or out of the cooling plate 352. Doors (not illustrated) that open and close the aforementioned openings may be provided in the cooling chamber 350.

The coating/developing module 400 performs a process of coating a photoresist on a substrate "W" before an exposing process and a process of developing the substrate "W" after the exposing process. The coating/developing module 400 has a substantially rectangular parallelepiped shape. The coating/developing module 400 has a coating module 401 and a development module 402. The coating module 401 and the development module 402 may be disposed to be partitioned from each other in different layers. According to an example, the coating module 401 is situated on the development module 402.

The coating module 401 performs a process of coating a photosensitive liquid, such as a photoresist, on a substrate "W" and a heat treatment process of, for example, heating and cooling the substrate "W" before and after the resist coating process. The coating module 401 has a resist coating chamber 410, a bake chamber 420, and a carrying chamber 430. The resist coating chamber 410, the bake chamber 420, and the carrying chamber 430 are sequentially disposed in the second direction 14. Accordingly, the resist coating chamber 410 and the bake chamber 420 are spaced apart from each other in the second direction 14 while the carrying chamber 430 is interposed therebetween. A plurality of resist coating chambers 410 may be provided in each of the first direction 12 and the third direction 16. In the drawings, six resist coating chambers 410 are illustrated by way of example. A plurality of bake chamber 420 may be provided in each of the first direction 12 and the third direction 16. In the drawings, six resist bake chambers 420 are illustrated by way of example. However, unlike this, a larger number of bake chambers 420 may be provided.

The carrying chamber 430 is positioned in parallel to the first buffer 320 of the first buffer module 300 in the first direction 12. A coating robot 432 and a guide rail 433 may be positioned in the carrying chamber 430. The carrying chamber 430 has a substantially rectangular shape. The coating robot 432 transfers a substrate "W" between the bake chambers 420, the resist coating chambers 400, the first buffer 320 of the first buffer module 300, and the first cooling chamber 520 of the second buffer module 500 The guide rail 433 is disposed such that the lengthwise direction thereof is parallel to the first direction 12. The guide rail 433 guides the coating robot 432 such that the coating robot 432 is linearly moved in the first direction 12. The coating robot 432 has a hand 434, an arm 435, a support 436, and a prop 437. The hand 434 is fixedly installed in the arm 435. The arm 435 has an extensible structure such that the hand 434 is movable horizontally. The length of the support 436 extends in the third direction 16. The arm 435 is coupled to the support 436 to be linearly movable in the third direction 16 along the support 436 The support 436 is fixedly coupled to the prop 437, and the prop 437 is coupled to the guide rail 433 to be movable along the guide rail 433

The resist coating chambers 410 have the same structure. However, the resist coating chambers 410 may employ mutually different types of photoresists. For example, a chemical amplification resist may be used as the photoresist. The resist coating chamber 410 coats a photoresist on the substrate W. The resist coating chamber 410 has a housing 411, a support plate 413, and a nozzle 413. The housing 411 has the shape of a cup having an open upper portion. The support plate 412 is positioned inside the housing 411 and supports the substrate W. The support plate 412 is rotatably provided. The nozzle 413 supplies a photoresist onto the substrate "W" placed on the support plate 412. The nozzle 413, which has a cylindrical tubular shape, supplies the photoresist to the center of the substrate W. Alternatively, the nozzle 413 has a length corresponding to the diameter of the substrate "W" and the discharge port of the nozzle 413 may be provided in the form of a slit. Additionally, the resist coating chamber 410 may further include a nozzle 414 supplying a cleaning liquid, such as deionized water, to clean the surface of the substrate W.

The bake chamber 410 is to perform heat treatment for the substrate W. For example, the bake chambers 420 perform a prebake process of eliminating organic substances and moisture from the surface of the substrate "W" by heating the substrate "W" at a predetermined temperature before coating a photoresist or a soft bake process performed after coating a photoresist to the substrate W, and performs a cooling process of cooling the substrate "W" after the heating processes. The bake chamber 420 has a cooling plate 421 and a heating plate 422. The cooling plate 421 includes a cooling unit 423 such as cooling water or a thermoelectric element. The heating plate 422 includes a heating unit 424 such as a heating wire or a thermoelectric element. The cooling plate 421 and the heating plate 422 may be provided in one bake chamber 420. Alternatively, some of the bake chambers 420 may include only a cooling plate 421, and some of the bake chambers 420 may include only a heating plate 422.

The development module 402 performs a development process of eliminating a portion of the photoresist by supplying a developing solution to obtain a pattern on the substrate W, and a heat treatment process, such as heating and cooling, which are performed with respect to the substrate "W" before and after the development process. The development module 402 has a development chamber 800, a bake chamber 470, and a carrying chamber 480. The development chamber 800, the bake chamber 470, and the carrying chamber 480 are sequentially disposed in the second direction 14. Accordingly, the development chamber 800 and the bake chamber 470 are spaced apart from each other in the second direction 14 while the carrying chamber 480 is interposed therebetween. A plurality of development chamber 800 may be provided in each of the first direction 12 and the third direction 16. In the drawings, six development chamber 800 are illustrated by way of example. A plurality of bake chamber 470 may be provided in each of the first direction 12 and the third direction 16. In the drawings, six resist bake chambers 470 are illustrated by way of example. However, unlike this, a larger number of bake chambers 470 may be provided.

The carrying chamber 480 is positioned in parallel to the first buffer 330 of the first buffer module 300 in the first direction 12. A development robot 482 and a guide rail 483 may be positioned in the carrying chamber 480. The carrying chamber 480 has a substantially rectangular shape. The development robot 482 transfers the substrate "W" between the bake chambers 470, the development chambers 460, the second buffer 330 and the cooling chamber 350 of the first buffer module 300, and the second cooling chamber 540 of the second buffer module 500 The guide rail 483 is disposed such that the lengthwise direction thereof is parallel to the first direction 12. The guide rail 483 guides the development robot 482 such that the development robot 482 is linearly movable in the first direction 12. The development robot 482 has a hand 484, an arm 485, a support 486, and a prop 487. The hand 484 is fixedly installed to the arm 485. The arm 485 has an extensible structure such that the hand 484 is movable horizontally. The length of the support 486 extends in the third direction 16. The arm 485 is coupled to the support 486 to be linearly movable in the third direction 16 along the support 486 The support 486 is fixedly coupled to the prop 487 The prop 487 is coupled to the guide rail 483 to be linearly movable along the guide rail 483.

The development chambers 800 have the same structure. However, the development chambers 800 may employ mutually different types of developing solutions. The development chambers 800 serves as a device performing development treatment with respect to the substrate. The development chambers 800 eliminate a region of the photoresist coated on the substrate W, to which light is irradiated. In this case, a region of a protective film, to which the light is irradiated, is eliminated together. Alternatively, only regions of the photoresist and the protective film, to which light is not irradiated, may be eliminated depending on the types of the photoresist.

Figure 5:
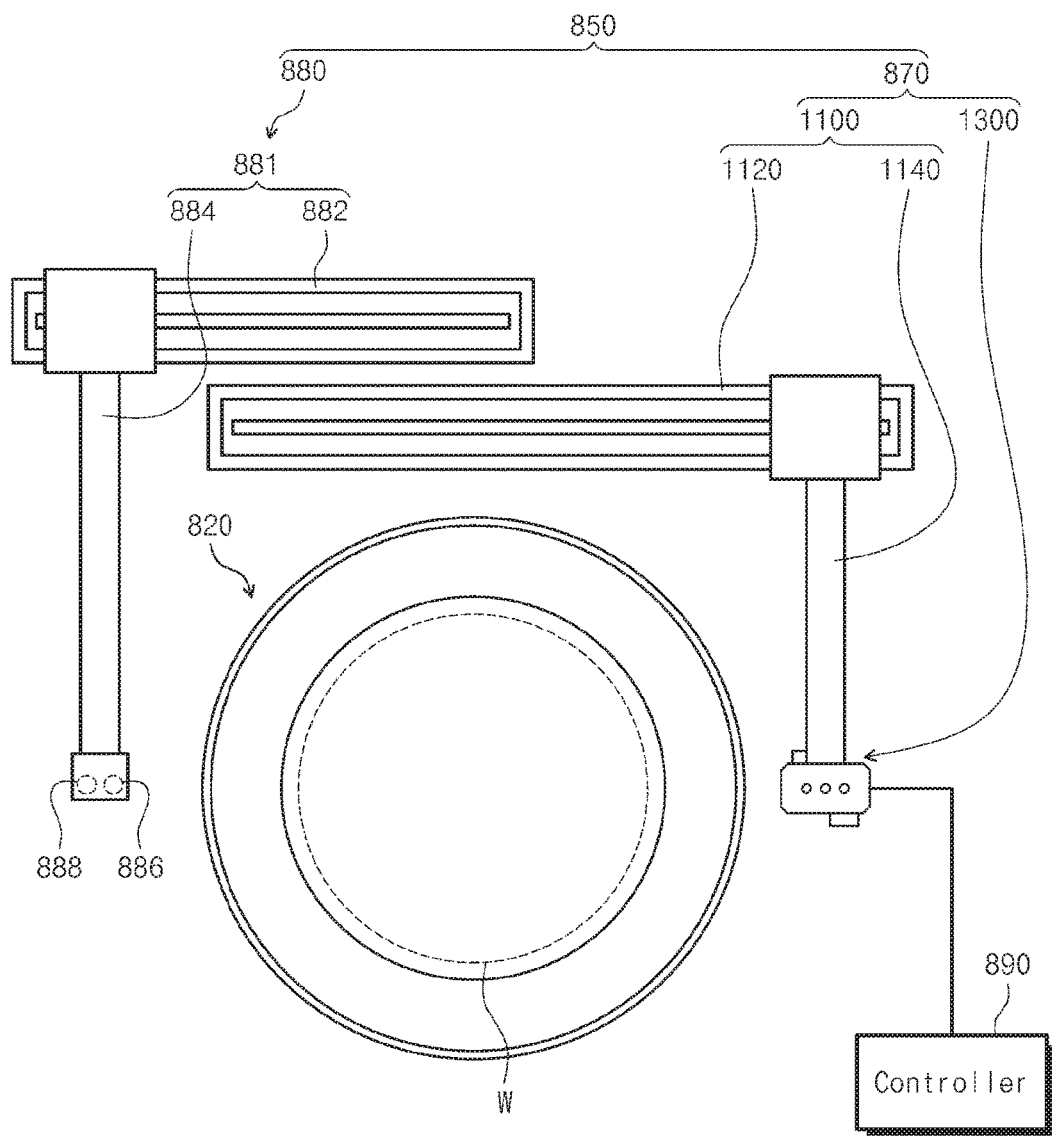
FIG. 5 is a plan view illustrating an apparatus for treating a substrate in FIG. 1.
Figure 6:
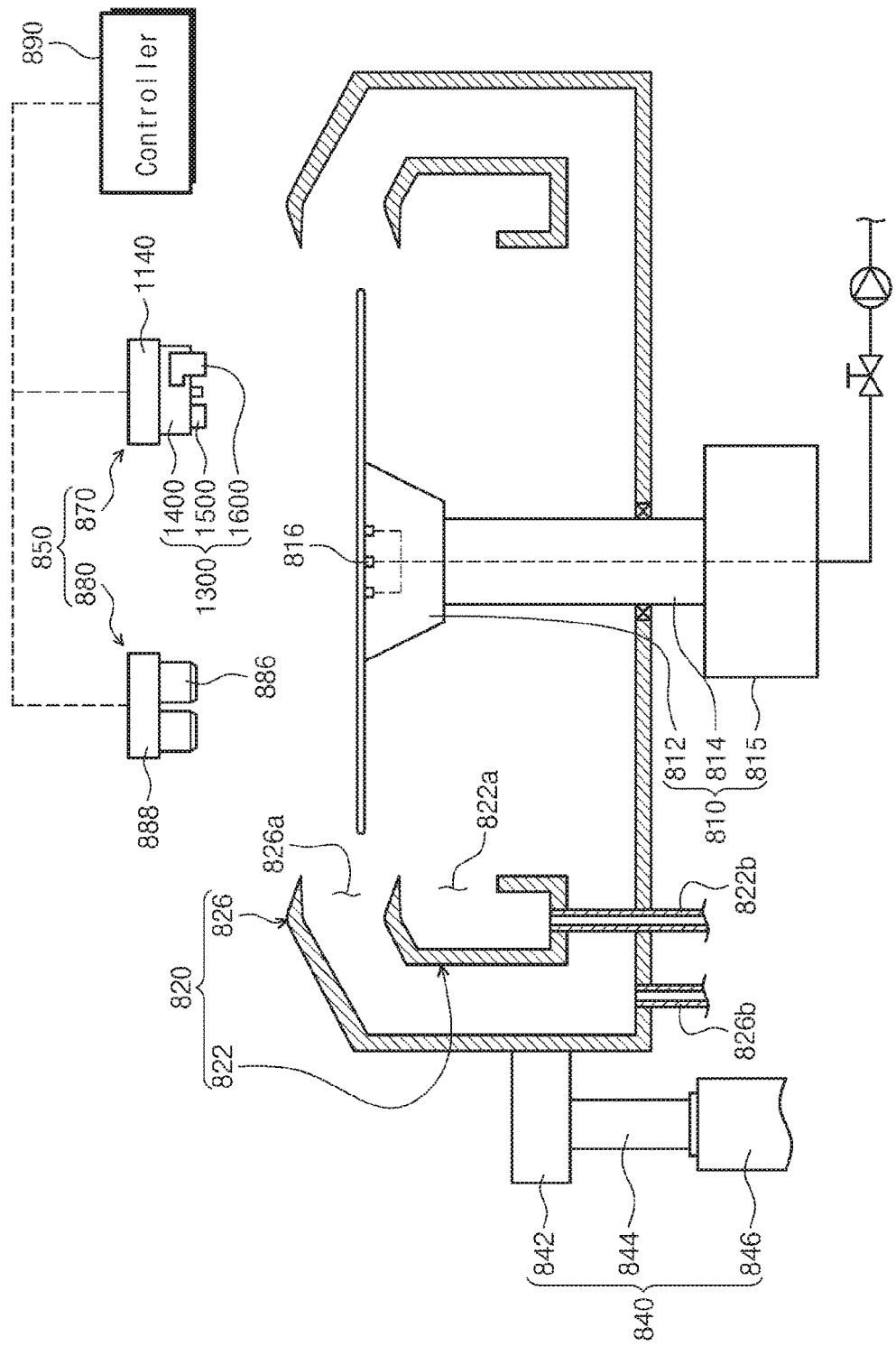
FIG. 6 is a sectional view illustrating the apparatus for treating the substrate in FIG. 5.

According to the present embodiment, the development chamber 800 may serve as an apparatus (hereinafter, referred to as "a substrate treating apparatus") 800 for treating a substrate "W" with a liquid. FIG. 5 is a plan view illustrating the substrate treating apparatus in FIG. 1, and FIG. 6 is a sectional view illustrating the substrate treating apparatus in FIG. 5. Referring to FIGS. 5 and 6, the substrate treating apparatus 800 performs a developing process with respect to a single substrate W. The substrate treating apparatus 800 may include a substrate supporting unit 810, a treatment container 820, an elevating unit 840, a liquid supplying unit 850, and a controller 890.

The substrate supporting unit 810 supports and rotates the substrate W. The substrate supporting unit 810 includes a support plate 812 and rotation driving members 814 and 815. The support plate 812 supports the substrate W. The support plate 812 is provided to have a circular plate shape. The support plate 812 may have a diameter smaller than that of the substrate W. A vacuum hole 816 is formed in a support surface of the support plate 812 and vacuum is provided to vacuum hole 816. The substrate "W" may be adsorbed onto the support surface by vacuum.

The rotation driving members 814 and 815 rotate the support plate 812. The rotation driving members 814 and 815 include a rotating shaft 814 and a driving unit 815. The rotating shaft 814 is provided to have the shape of a bar having the length extending in the vertical direction. The rotating shaft 814 is engaged with the bottom surface of the support plate 812. The driving unit 815 may transmit a rotational force to the rotating shaft 814. The rotating shaft 814 is rotatable about the central axis by the rotational force provided from the driving unit 815. The support plate 812 is rotatable together with the rotating shaft 814. The revolutions per minute (RPM) of the rotating shaft 814 is adjusted to adjust the RPM of the substrate W. For example, the driving unit 815 may be a motor.

The treatment container 820 provides a treatment space in which the developing process is performed. The treatment container 820 recovers a liquid used in the developing process. The treatment container 820 is provided in the shape of a cup having an open upper portion. The treatment container 820 includes an inner recovery container 822 and an outer recovery container 826. The recovery containers 822 and 826 recover mutually different types of liquids among liquids used in the developing process. The inner recovery container 822 is provided in the shape of a circular ring surrounding the substrate supporting unit 810 and the outer recovery container 826 is provided in the shape of a circular ring surrounding the inner recovery container 822 when viewed in the sectional view. An inner space 822a of the inner recovery container 822 and a space 826a between the outer recovery container 826 and the inner recovery container 822 function as inlets for introducing liquids into the inner recovery container 822 and the outer recovery container 826, respectively. Recovery lines 822b and 826b are connected with the recovery containers 822 and 826 to vertically extend downward from the bottom surfaces of the recovery containers 822 and 826. The recover lines 822b and 826b discharge the liquids introduced into the recovery containers 822 and 826, respectively. The discharged liquids may be recycled through an external treatment liquid recycling system (not illustrated).

The elevating unit 840 may adjust the relative height between the treatment container 820 and the substrate W. The elevating unit 840 moves the treatment container 820 in the vertical direction. The elevating unit 840 includes a bracket 842, a moving shaft 844, and a driving unit 846. The bracket 842 couples the treatment container 820 to the moving shaft 844. The bracket 842 is fixedly mounted on a vertical wall 822 of the treatment container 820. The moving shaft 844 is provided to have the length extending in the vertical direction. The upper end of the moving shaft 844 is fixedly coupled to the bracket 842. The moving shaft 844 moves in the vertical direction by the driving unit 846 and the treatment container 820 is lifted together with the moving shaft 844. For example, the driving unit 846 may be a cylinder or a motor.

The liquid supplying unit 850 supplies a liquid to the substrate "W" supported by the substrate supporting unit 810. The liquid supplying unit 850 includes a treatment liquid supplying member 870 and a rinse liquid supplying member 880. The treatment liquid supplying member 870 supplies a pre-wetting liquid, a first treatment liquid, and a second treatment liquid. The rinse liquid supplying member 880 fees a rinse liquid and dry gas.

The treatment liquid supplying member 870 includes a nozzle unit 1300 and a first moving unit 1100. The first moving unit 1100 moves the nozzle unit 1300 in the first direction 12. The first moving unit 1100 moves the nozzle unit 1300 to a process position or a standby position. In this case, the process position is a position of the nozzle unit 1300 facing the substrate "W" and the standby position is a position of the nozzle unit 1300 out of the process position. The first moving unit 1100 includes a first guide rail 1120 and a first arm 1140. The first guide rail 1120 is positioned at one side of the treatment container 820. The first guide rail 1120 is provided to have a lengthwise direction parallel to the moving direction of the nozzle unit 1300. For example the first guide rail 1120 may be provided to have the length extending in the first direction 12. The first arm 1140 is provided to have the shape of a bar. When viewed from the top, the first arm 1140 is provided to have a lengthwise direction perpendicular to the first guide rail 1120. The first arm 1140 may be provided to have the length extending in the second direction 14 perpendicular to the first direction 12. The first arm 1140 has one end coupled to the nozzle unit 1300 and an opposite end coupled to the first guide rail 1120. Accordingly, the first arm 1140 and the nozzle unit 1300 move together in a lengthwise direction of the guide rail 1120.

The nozzle unit 1300 discharges a pre-wetting liquid in a stream manner and supplies the first treatment liquid and the second treatment liquid in the stream manner and a liquid curtain manner. For example, the pre-wetting liquid for wetting the surface of the substrate "W" may be supplied onto the substrate "W" before supplying the treatment liquids.

Figure 7:
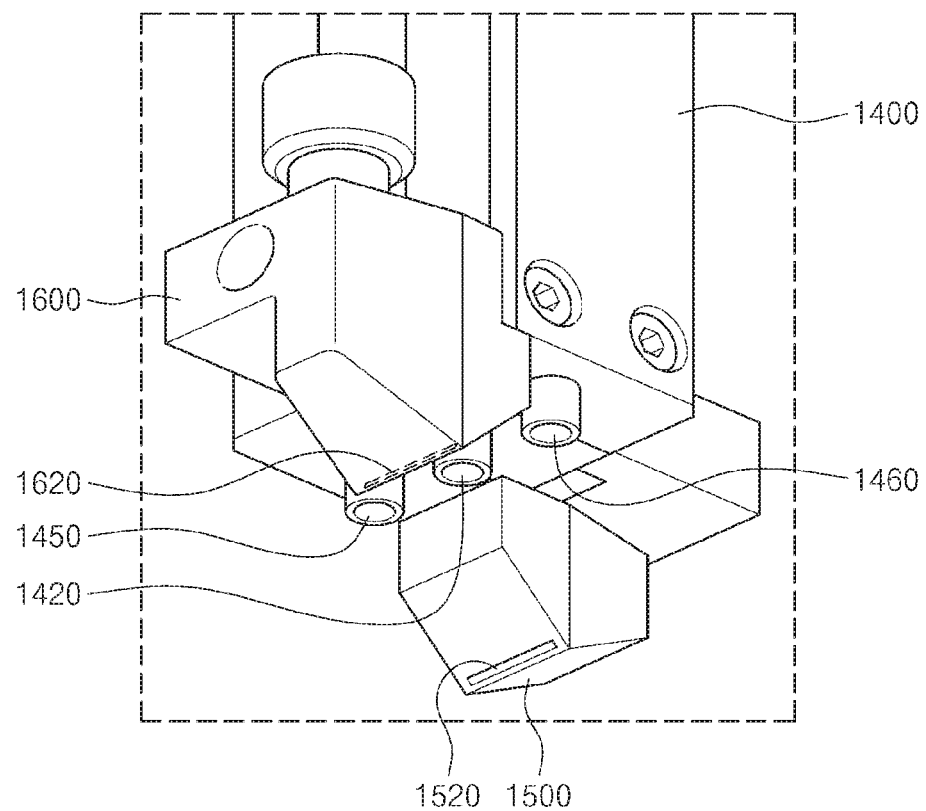
FIG. 7 is a perspective view illustrating a nozzle unit of FIG. 6.
Figure 8:
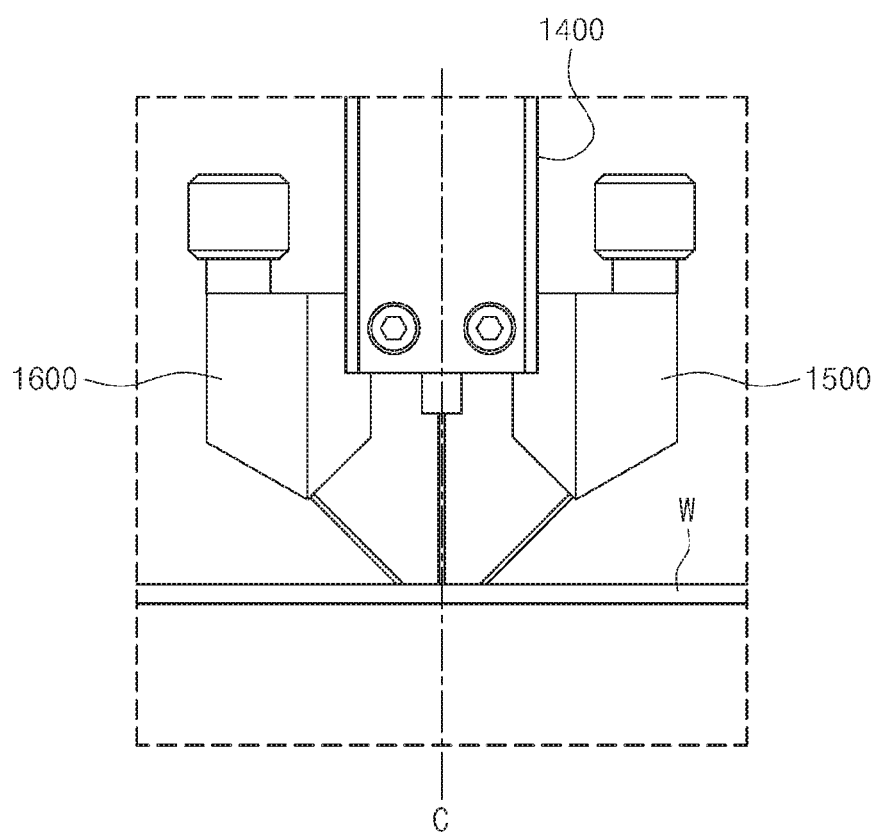
FIG. 8 is a side view illustrating the nozzle unit of FIG. 7.

FIG. 7 is a perspective view illustrating the nozzle unit of FIG. 6, and FIG. 8 is a side view illustrating the nozzle unit of FIG. 7. Referring to FIGS. 7 and 8, the nozzle unit 1300 includes a main body 1400, a first body 1500, and a second body 1600. The main body 1400 is formed in a bottom surface thereof with a first circular discharge port 1450, a wetting liquid discharge port 1420, and a second circular discharge port 1460. The first circular discharge port 1450, the wetting liquid discharge port 1420, and the second circular discharge port 1460 are sequentially arranged in the first direction 12. The first treatment liquid is discharged in the stream manner through the first circular discharge port 1450. The pre-wetting liquid is discharged in the stream manner through the wetting liquid discharge port 1420. The second treatment liquid is discharged in the stream manner through the second circular discharge port 1460. When viewed from the top, the moving path of the nozzle unit 1300 may include a position of matching the wetting liquid discharge port 1420, the first circular discharge port 1450, and the second circular discharge port 1460 with the center of the substrate W.

The first body 1500 is coupled to one side of the main body 1400. The first body 1500 has a first slit discharge port 1520 formed therein. The first slit discharge port 1520 has a lengthwise direction parallel to the first direction 12. The first slit discharge port 1520 is inclined downward in a direction facing the main body 1400. When viewed from the top, the first slit discharge port 1520 and the first circular discharge port 1450 may be positioned to face each other in the second direction 14 perpendicular to the first direction 12. For example, the first treatment liquid may be a developing solution.

The second body 1600 is coupled to another side of the main body 1400. In this case, the another side of the main body 1400 serves as a side opposite to the one side of the main body 1400. The one side and the another side of the main body 1400 serve as opposite sides in the second direction. The second body 1600 has a second slit discharge port 1620 formed therein. The second slit discharge port 1620 has a lengthwise direction parallel to the first direction 12. The second slit discharge port 1620 is inclined downward in a direction facing the main body 1400. When viewing the nozzle unit 1300 in the first direction 12, the first slit discharge port 1520 and the second slit discharge port 1620 are inclined downward while approaching each other. When viewed from the top, the second slit discharge port 1620 and the second circular discharge port 1460 may be positioned to face each other in the second direction. For example, the second treatment liquid may be different from the first treatment liquid. One of the first treatment liquid and the second treatment liquid may be selectively supplied to a single substrate W. The first treatment liquid may be supplied to a first substrate W1 and the second treatment liquid may be supplied to a second substrate W2.

According to an embodiment, the first slit discharge port 1520 and the second slit discharge port 1620 may be formed to be offset from each other about a line passing through the wetting liquid discharge port 1420 while extending in the second direction. The discharge ports 1420, 1450, and 1460 employing the stream manner and formed in the main body 1400 have lower ends higher than the first slit discharge port 1520 and the second slit discharge port 1620. Accordingly, it may be minimized that the treatment liquid discharged in the liquid curtain manner is scattered from the substrate "W" and sticks to the discharge ports 1420, 1450, and 1460 employing the stream manner.

The rinse liquid supplying member 880 supplies a rinse liquid in the stream manner. The rinse liquid supplying member 880 includes a rinse liquid nozzle 886, a gas nozzle 888, and a second moving unit 881. The second moving unit 881 linearly moves the rinse liquid nozzle 886 and the gas nozzle 888. The second moving unit 881 simultaneously moves the rinse liquid nozzle 886 and the gas nozzle 888 to the process position or the standby position. The second moving unit 881 includes a second guide rail 882 and a second arm 884. The second guide rail 882 is positioned at one side of the treatment container 820. The second guide rail 882 is provided to have a lengthwise direction parallel to the moving directions of the rinse liquid nozzle 886 and the gas nozzle 888. The second guide rail 882 may be provided to have the length extending in the first direction 12. The second arm 884 is provided to have the shape of a bar. When viewed from the top, the second arm 884 is provided to have a lengthwise direction perpendicular to the second guide rail 882. For example, the second arm 884 may be provided to have the length extending in the second direction 14 perpendicular to the first direction 12. The second arm 884 has one end coupled to the rinse liquid nozzle 886 and the gas nozzle 888 and an opposite end coupled to the second guide rail 882. Accordingly, the second arm 884, the rinse liquid nozzle 886, and the gas nozzle 888 move together the lengthwise direction of the second guide rail 882.

The process position of the rinse liquid nozzle 886 and the gas nozzle 888 includes a position facing a region between the center of the substrate "W" and the end of the substrate W. In contrast, the process position of the nozzle unit 1300 includes a position facing a region between opposite ends of the substrate W. Accordingly, the moving path of the nozzle unit 1300 is provided to be longer than that of the rinse liquid nozzle 886 and the gas nozzle 888 and the first guide rail 1120 is provided to be longer than the second guide rail 882.

The controller 890 controls the liquid supplying unit 850 such that the nozzle unit 1300 moves in the first direction 12. When viewed from the top, the controller 890 moves the nozzle unit 1300 between the central region and an edge region of the substrate "W" such that a discharge region of the liquid overlaps with a line passing through the center of the substrate "W" while extending in the first direction 12. The controller 890 moves the nozzle unit 1300 such that the discharge region of the liquid is moved from the central region of the substrate "W" toward the edge region of the substrate W. According to an embodiment, when viewed from the top, a line passing through the center of the substrate "W" while extending in the second direction 14 may be positioned between the first discharge region of the first treatment liquid and the second discharge region of the second treatment liquid. In other words, the first treatment liquid may be supplied to one side of the substrate "W" about the line passing through the center of the substrate "W" while extending in the second direction 14. The second treatment liquid may be supplied to an opposite side of the substrate "W" about the line passing through the center of the substrate "W" while extending in the second direction 14. The nozzle unit 1300 may be moved such that the discharging direction of the first treatment liquid and the discharging direction of the second treatment liquid face the downstream side of the rotation direction of the substrate W.

Figure 9:
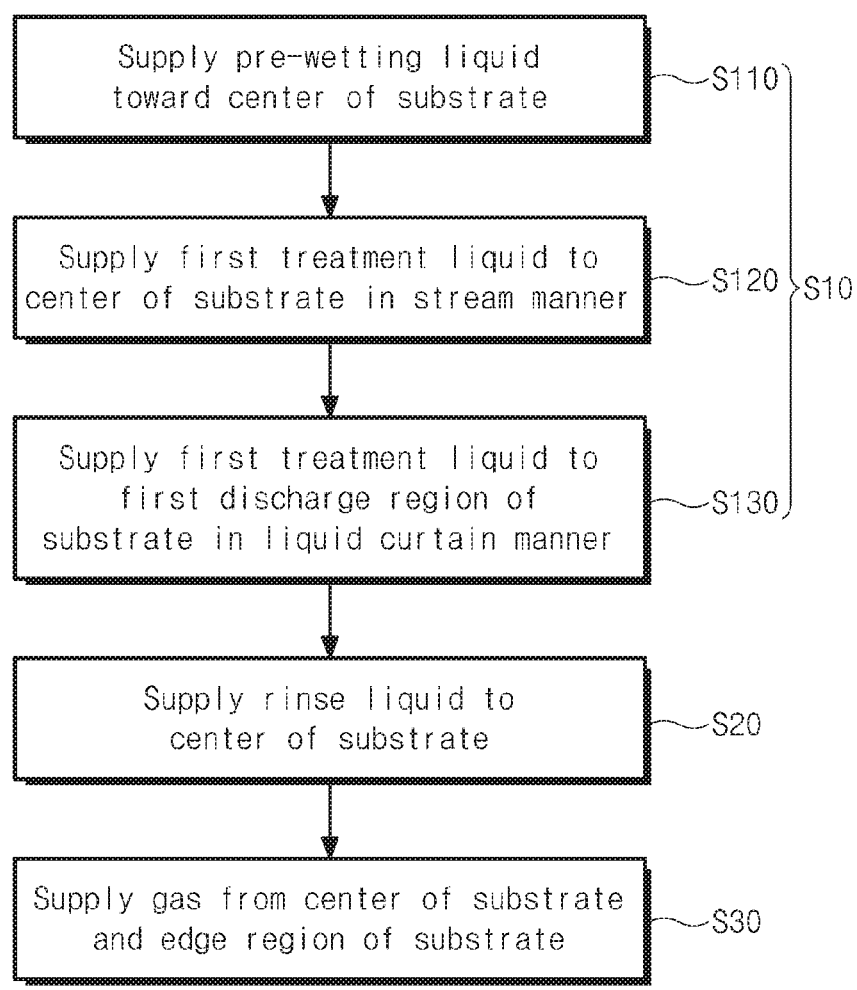
FIG. 9 is a flowchart illustrating a procedure of performing liquid treatment with respect to the substrate by using the apparatus of FIG. 5.
Figure 10:
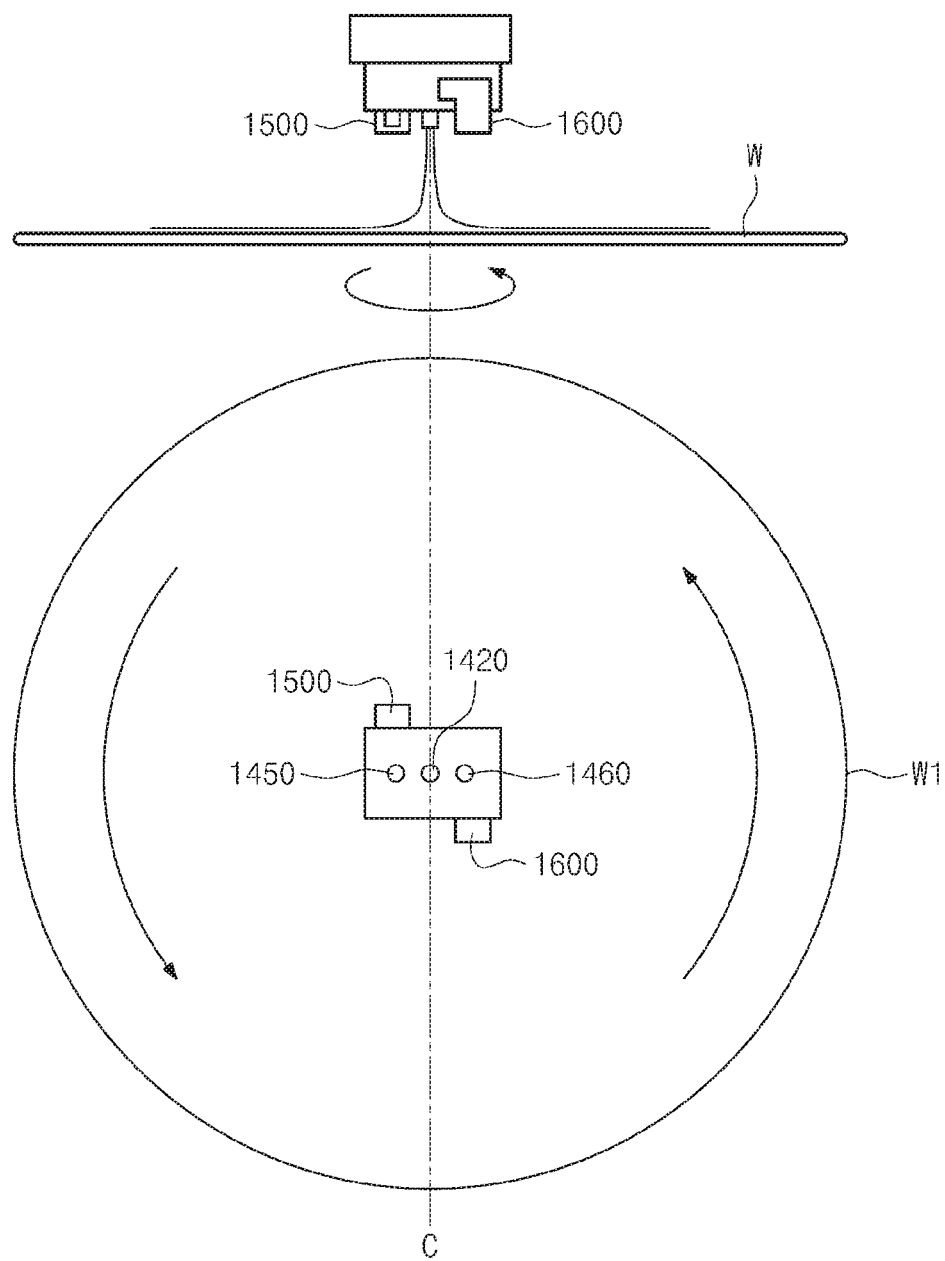
FIGS. 10 to 12 are views illustrating procedures of treating a first substrate with a first treatment liquid by using the apparatus of FIG. 9.
Figure 11:
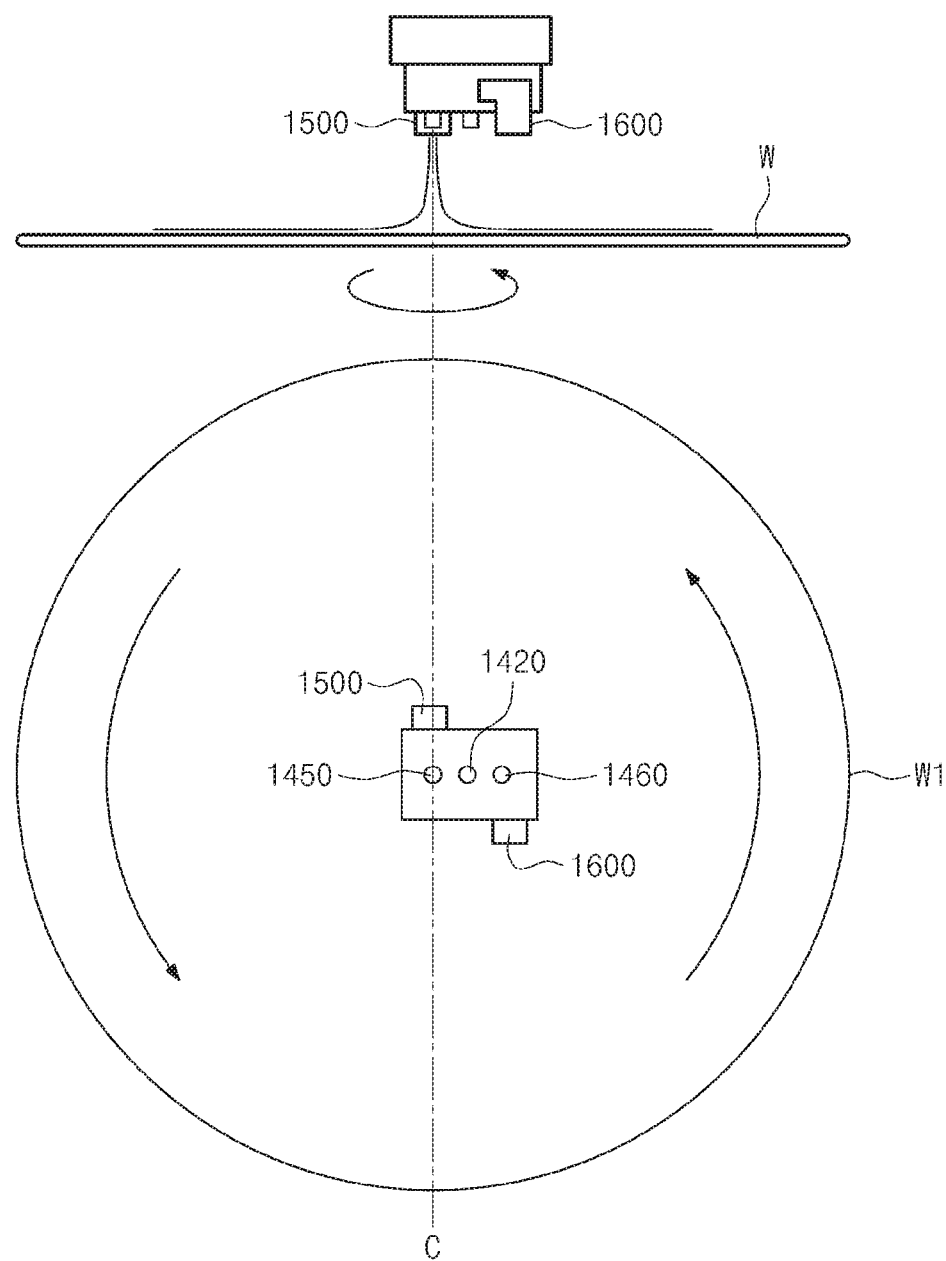
Figure 12:
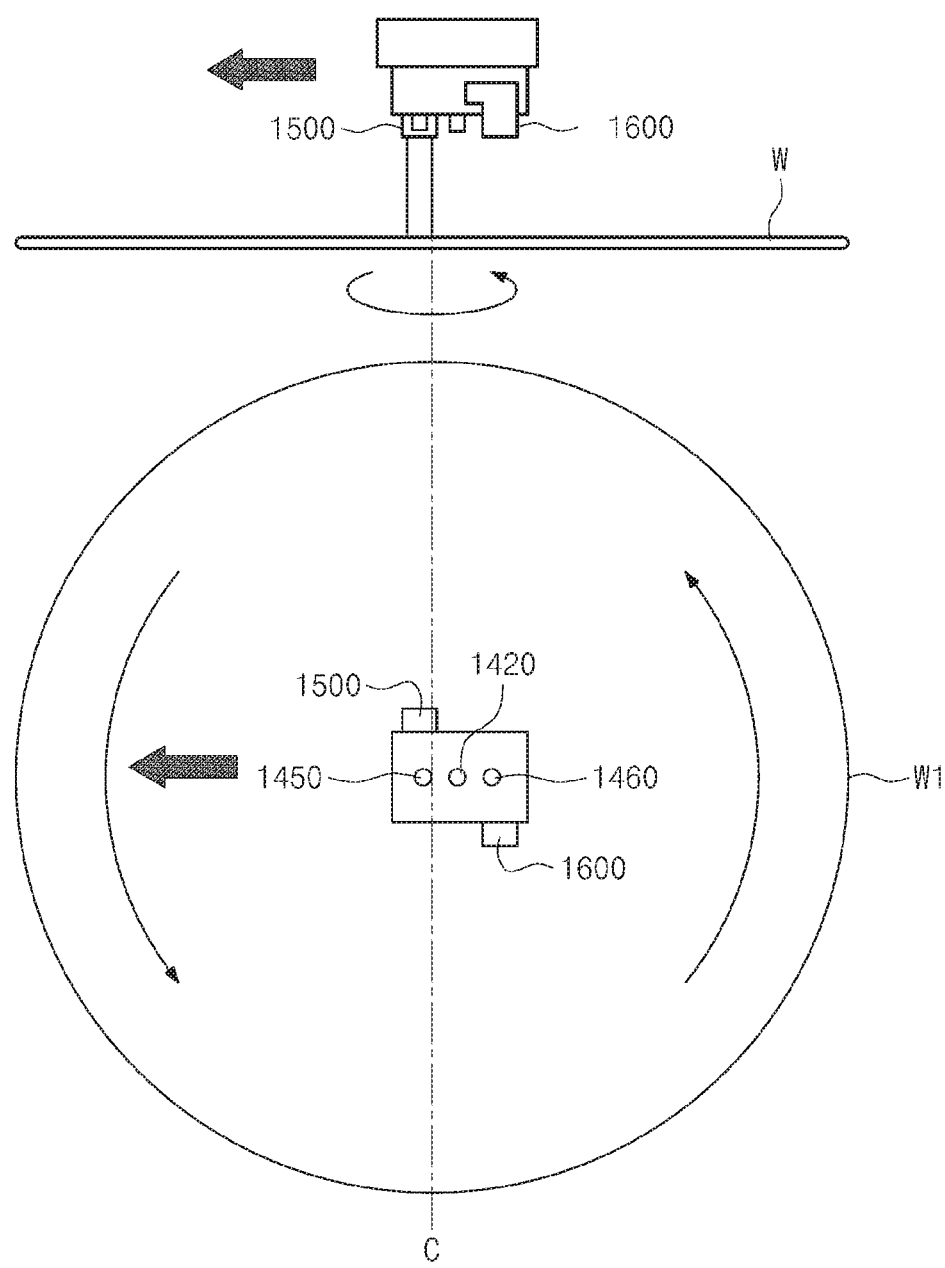

Hereinafter, a procedure of treating the substrate "W" by using the above-described substrate treating apparatus will be described. FIG. 9 is a flowchart illustrating a procedure of performing liquid treatment with respect to a first substrate by using the substrate treating apparatus of FIG. 5, and FIGS. 10 to 12 are views illustrating procedures of treating the first substrate with a first treatment liquid by using the substrate treating apparatus of FIG. 9. Referring to FIGS. 9 to 12, a method for treating a first substrate W1 includes a first liquid treatment process S10, a rinsing step S20, and a drying step S30. The first liquid treatment process S10, the rinsing step S20, and the drying step S30 are sequentially performed.

The first liquid treatment process S10 is to supply the first treatment liquid to the first substrate W1. The first liquid treatment process S10 includes a wetting liquid supplying step S110, a first stream-supplying step S120, and a first liquid curtain-supplying step S130.

The wetting liquid supplying step S110 is to supply a pre-wetting liquid to the first substrate W1. In the wetting liquid supplying step S110, the wetting liquid discharge port 1420 is positioned to face the center of the first substrate W1. The pre-wetting liquid is supplied to the center of the first substrate W1 and diffused to the whole region of the first substrate W1 by the rotation of the first substrate W1. The surface of the first substrate W1 is wet by the pre-wetting liquid.

In the first stream-supplying step S120, the first treatment liquid is supplied onto the first substrate W1 in the stream manner. In the first stream-supplying step S120, a first stream discharge port is positioned to face the center of the first substrate W1. The first treatment liquid is supplied to the center of the first substrate W1 and diffused to the whole region of the first substrate W1 by the rotation of the first substrate W1.

In the first liquid curtain-supplying step S130, the first treatment liquid is supplied to the first substrate W1 in the liquid-curtain manner. In the first liquid curtain-supplying step S130, the first treatment liquid is supplied to the first discharge region. The nozzle unit 1300 is provided at a position in which the first treatment liquid is directed to the downstream side of the rotation direction of the first substrate W1. Accordingly, as the first treatment liquid is discharged in a downward-inclined direction and the substrate is rotated, the scattering of the first treatment liquid may be minimized. The first discharge region includes a region between the center and the edge region of the first substrate W1. The first discharge region is changed from the central region of the first substrate W1 to the edge region of the first substrate W1 in the first direction 12.

When the first liquid treatment process S10 is finished, the nozzle unit 130 is moved to the standby position and the rinsing step S20 is performed. In the rinsing step S20, the rinse liquid nozzle 886 is moved to the process position. The rinse liquid nozzle 886 supplies a rinse liquid to the center of the first substrate W1. The rinse liquid is used to rinse the first treatment liquid remaining on the first substrate W1.

When the rinsing step S20 is finished, the drying step S30 is performed. In the drying step S30, the gas nozzle 888 supplies dry gas onto the first substrate W1. In the drying step S30, the dry gas is supplied from the center of the first substrate W1 toward the edge region of the first substrate W1. Accordingly, the remaining rinse liquid is pushed out of the first substrate W1.

Figure 13:
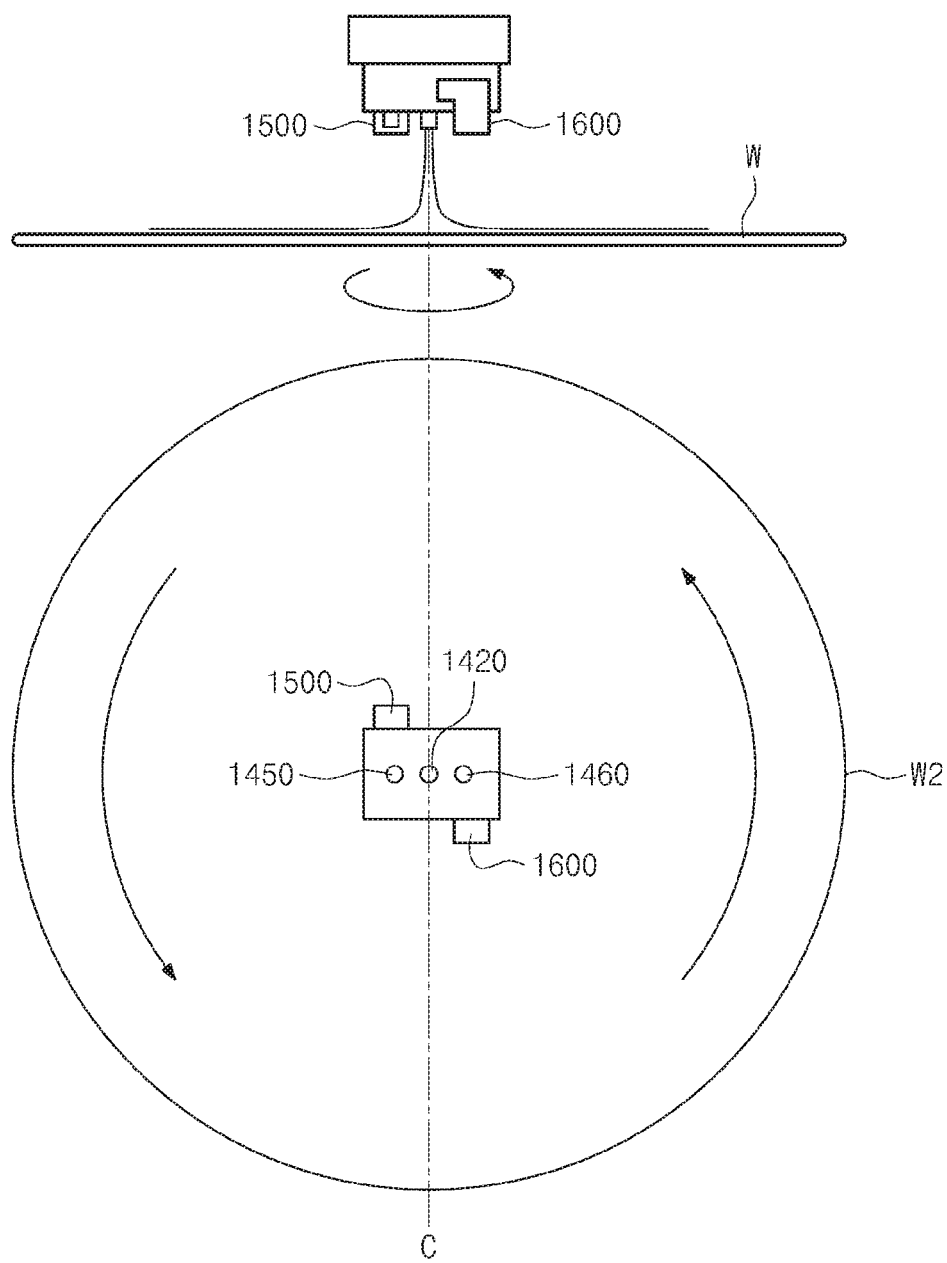
FIGS. 13 to 15 are views illustrating procedures of supplying a second treatment liquid onto a second substrate by using the apparatus of FIG. 9.
Figure 14:
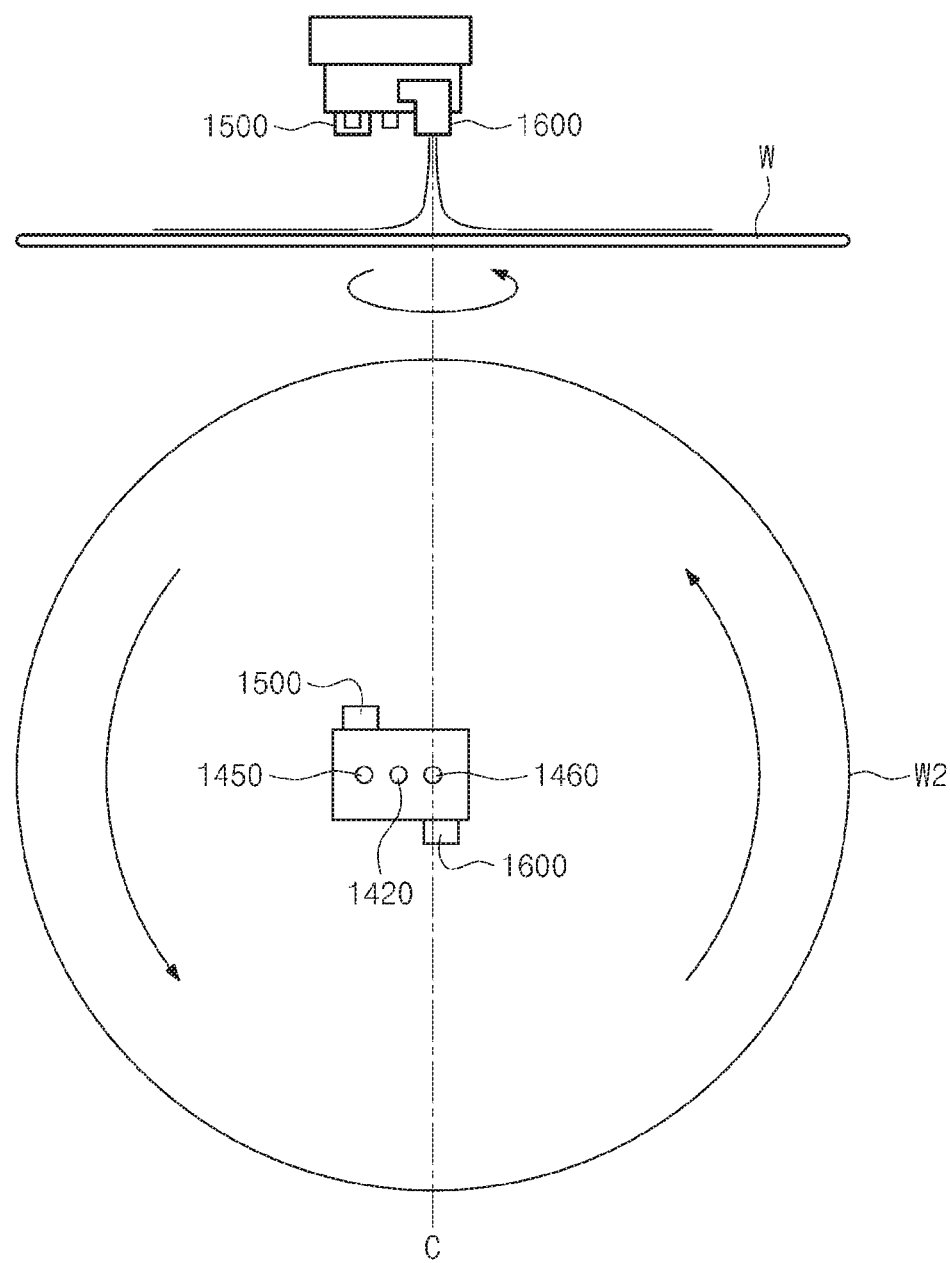
Figure 15:
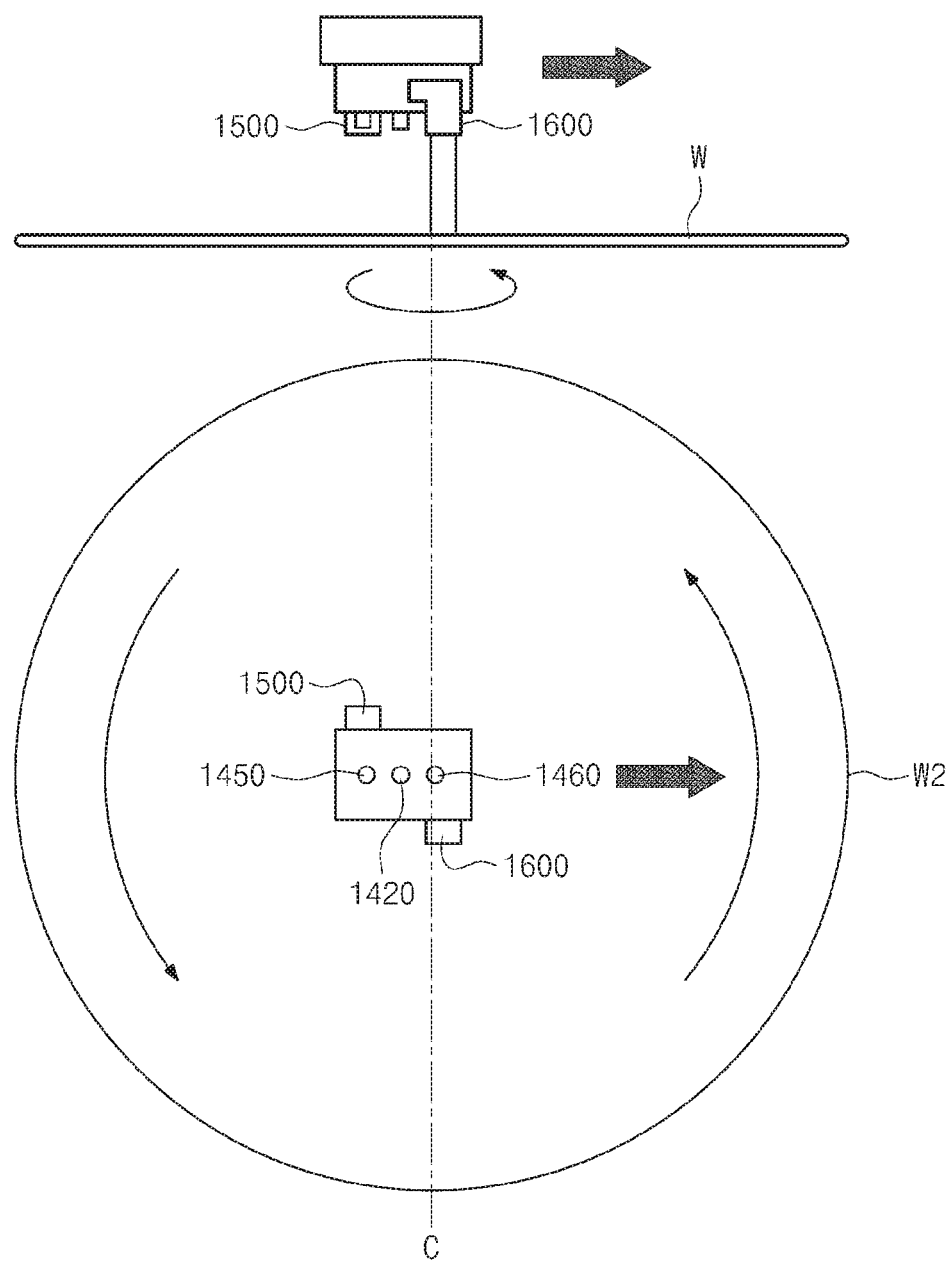

Hereinafter, a procedure of treating a second substrate W2 different from the first substrate W1 will be described. A method for performing liquid treatment with respect to the second substrate W2 includes a second liquid treatment process, a rinsing step, and a drying step which are sequentially performed. Since the rinsing step and the drying step for the second substrate W2 are identical to the rinsing step S20 and the drying step S30 for the first substrate W1, the details thereof will be omitted in the following description. FIGS. 13 to 15 are views illustrating procedures of supplying a second treatment liquid onto the second substrate by using the substrate treating apparatus of FIG. 9. Referring to FIGS. 13 to 15, the second liquid treatment process is to supply the second treatment liquid onto the second substrate W2. The second liquid treatment process includes a wetting liquid supplying step, a second stream-supplying step, and a second liquid curtain-supplying step.

The wetting liquid supplying step is to supply a pre-wetting liquid to the second substrate W2. The pre-wetting liquid wets the surface of the second substrate W2.

In the second stream-supplying step, the second treatment liquid is supplied to the second substrate W2 in the stream manner. In the second stream-supplying step, a second stream discharge port is positioned to face the center of the second substrate W2. The second treatment liquid is supplied to the center of the second substrate W2 and diffused to the whole region of the second substrate W2 by the rotation of the second substrate W2.

In the second liquid curtain-supplying step, the second treatment liquid is supplied to the second substrate W2 in the liquid curtain manner. In the second liquid curtain-supplying step, the second treatment liquid is supplied to the second discharge region. The nozzle unit 1300 is provided at a position in which the second treatment liquid is directed to the downstream side of the rotation direction of the second substrate W2. Accordingly, the moving direction of the first slit discharge port 1520 in the first liquid treatment process S10 is opposite to the moving direction of the second slit discharge port 1620 in the second liquid treatment process. In other words, the first discharge region is symmetrical to the second discharge region about the line passing through the center of the substrate while extending in the second direction 14. The second discharge region includes a region between the center and the edge region of the second substrate W2. The second discharge region is changed from the central region of the second substrate W2 to the edge region of the second substrate W2 in a direction opposite to the first direction 12.

As described above, according to the embodiment, the substrate treating apparatus may supply a plurality of treatment liquids by using a single nozzle unit 1300. Accordingly, liquid treatment may be performed with respect to the first substrate W1 and the second substrate W1 which have to be supplied with respect treatment liquids different from each other.

Figure 16:
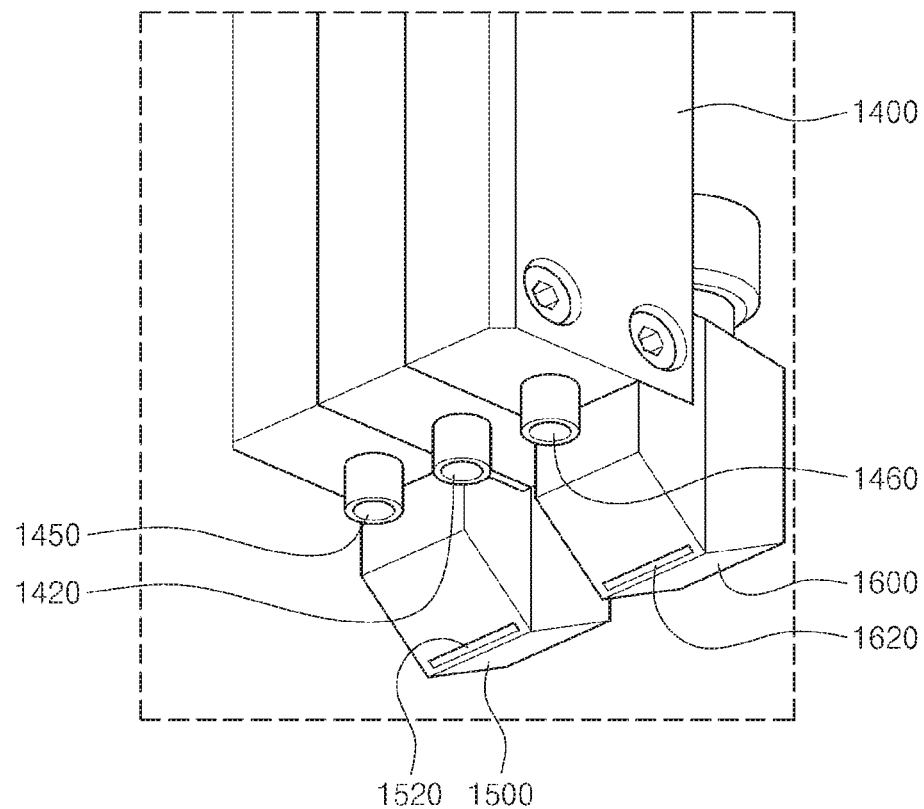
FIG. 16 is a perspective view illustrating another embodiment of the nozzle unit of FIG. 7.

In addition, the above embodiment has been described regarding that the first body 1500 is coupled to one side of the main body 1400 and the second body 1600 is coupled to an opposite side of the main body 1400. However, as illustrated in FIG. 16, the first body 1500 and the second body 1600 may be coupled to the one side of the main body 1400. When viewed from the top, the first slit discharge port 1520 and the first circular discharge port 1450 may be positioned to face each other in the second direction 14, and the second slit discharge port 1620 and the second circular discharge port 1460 may be positioned to face each other in the second direction. The first slit discharge port 1520 and the second slit discharge port 1620 may be formed to be offset from each other about a line passing through the wetting liquid discharge port 1420 while extending in the second direction 14. The first slit discharge port 1520 and the second slit discharge port 1620 may be provided to be inclined downward in the direction of approaching the main body 1400. In this case, since the first treatment liquid and the second treatment liquid discharged in the liquid curtain manner have to be supplied in the direction of facing the downstream side of the rotation direction of the substrate W, the first discharge region may overlap with the second discharge region.

Referring back to FIGS. 1 to 4, the bake chamber 420 of the development module 402 heat-treats the substrate W. the bake chambers 470 may perform a post bake process of heating the substrate "W" before the development process, a hard bake process of heating the substrate "W" after the development process, and a cooling process of cooling the heated substrate after the bake process The bake chamber 470 has the cooling plate 471 and the heating plate 472 The cooling plate 471 includes the cooling unit 473 such as cooling water or a thermoelectric element. The heating plate 472 includes the heating unit 474 such as a heating wire or a thermoelectric element. The cooling plate 471 and the heating plate 472 may be provided in one bake chamber 470. Alternatively, some of the bake chambers 470 may include only a cooling plate 471, and some of the bake chambers 420 may include only a heating plate 472.

As described above, the coating/developing module 400 is provided such that the coating module 401 and the development module 402 are separated from each other. When viewed from the top, the coating module 401 and the development module 402 may have the same chamber arrangement.

The second buffer module 500 is provided as a passage through which the substrate "W" is transported, between the coating/developing module 400 and the pre/post-exposure module 600. In addition, the second buffer module 500 performs a specific process, such as a cooling process or an edge exposing process, with respect to the substrate W. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the coating module 401. The second cooling chamber 540 is disposed at a height corresponding to the development module 402. The buffer 520, the first cooling chamber 530, and the second cooling chamber 540 are disposed in a row in the third direction 16. When viewed from the top, the buffer 520 is disposed along the carrying chamber 430 of the coating module 401 in the first direction 12. The edge exposing chamber 550 is spaced apart from the buffer 520 or the first cooling chamber 530 by a specific distance in the second direction 14.

The second buffer robot 560 transports the substrate "W" between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform the subsequent processes with respect to the substrates "W" which has been subject the process in the coating module 401. The first cooling chamber 530 cools the substrate "W" subject to the process in the coating module 401. The first cooling chamber 530 has a structure similar to that of the cooling chamber 350 of the first buffer module 300. The edge exposing chamber 550 exposes the edge regions of the substrates "W" subject to the cooling process in the first cooling chamber 530. The buffer 520 temporarily stores the substrates "W" before the substrates "W" subject to the exposing process in the edge exposing chamber 550 are transported to a pre-treatment module 601 to be described below. The second cooling chamber 540 cools the substrates "W" before the substrates "W" subject to the process in a post-treatment module 602, which will be described below, are transported to the development module 402. The second buffer module 500 may further have a buffer at a height corresponding to the development module 402. In this case, the substrates "W" subject to the process in the post-treatment module 602 may be transported to the development module 402 after being temporarily stored in the added buffer.

When the exposure apparatus 900 performs an immersion/exposure process, the pre/post-exposure module 600 may perform a process of coating a protective film that protects the photoresist film coated to the substrate "W" during the immersion/exposure process. The pre/post-exposure module 600 may perform a process of cleaning the substrate "W" after the exposure process. Furthermore, when the coating process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate "W" before the exposure process, and the post-treatment module 602 performs a process of treating the substrate "W" after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the coating module 401. The post-treatment module 602 has the same height as that of the development module 402. The pre-treatment module 601 has a protective film coating chamber 610, a bake chamber 620, and a carrying chamber 630. The protective film coating chamber 610, the carrying chamber 630, and the bake chamber 620 are sequentially disposed along the second direction 14. Accordingly, the protective film coating chamber 610 and the bake chamber 620 are spaced apart from each other in the second direction 14 while the carrying chamber 630 is interposed therebetween. A plurality of protective film coating chambers 610 are provided, and the plurality of protective film coating chambers 610 are arranged in the third direction 16 to form different layers. Alternatively, a plurality of protective film coating chambers 610 may be provided in each of the first direction 12 and the third direction 16. A plurality of bake chambers 620 are provided, and the plurality of bake chambers 610 are arranged in the third direction 16 to form different layers. Alternatively, a plurality of bake chamber 620 may be provided in each of the first direction 12 and the third direction 16.

The carrying chamber 630 is positioned in parallel to the first buffer 530 of the second buffer module 500 in the second direction 12. A pre-treatment robot 632 is situated in the carrying chamber 630. The carrying chamber 630 has a substantially rectangular shape. The pre-treatment robot 632 supplies the substrate "W" between the protective film coating chambers 610, the bake chambers 620, the buffer 520 of the second buffer module 500, and a first buffer 720 of the interface module 700, which will be described below The pre-treatment robot 632 has a hand 633, an arm 634, and a support 635. The hand 633 is fixedly installed in the arm 634 The arm 634 has an extensible and rotatable structure. The arm 634 is coupled to the support 635 to be linearly movable in the third direction 16 along the support 635.

The protective film coating chamber 610 coats a protective film that protects a resist film during the immersion/exposure process, onto the substrate W. The resist coating chamber 610 has a housing 611, a support plate 613, and a nozzle 413. The housing 611 has the shape of a cup having an open upper portion. The support plate 612 is positioned inside the housing 611 and supports the substrate W. The support plate 612 is rotatably provided. The nozzle 613 supplies a protection liquid for forming a protective film onto the substrate "W" positioned on the support plate 612. The nozzle 613, which has a cylindrical tubular shape, supplies the photoresist to the center of the substrate W. Alternatively, the nozzle 613 has a length corresponding to the diameter of the substrate "W" and the discharge port of the nozzle 613 may be provided in the form of a slit. In this case, the support plate 612 may be provided in a fixed state. The protection liquid includes a foamable material. The protection liquid may be a material that has a low affinity for a photoresist and water. For example, the protection liquid may include a fluorine-based solvent. The protective film coating chamber 610 supplies a protection liquid to a central area of the substrate "W" while rotating the substrate "W" positioned on the support plate 612.

The bake chamber 620 heat-treats the substrate W, on which the protective film is coated. The bake chamber 620 has a cooling plate 621 and a heating plate 622. The cooling plate 621 includes a cooling unit 623 such as cooling water or a thermoelectric element. The heating plate 622 includes the heating unit 624 such as a heating wire or a thermoelectric element. The cooling plate 622 and the heating plate 621 may be provided in one bake chamber 620. Alternatively, some of the bake chambers 620 may include only a cooling plate 622, and some of the bake chambers 620 may include only a heating plate 621.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed in the second direction 14. Accordingly, the cleaning chamber 660 and the post-exposure bake chamber 670 are spaced apart from each other in the second direction 14 while the carrying chamber 680 is interposed therebetween A plurality of cleaning chambers 660 are provided, and the plurality of cleaning chambers 610 are disposed in the third direction 16 to form different layers Alternatively, a plurality of cleaning chambers 660 may be provided in each of the first direction 12 and the third direction 16. A plurality of post-exposure bake chambers 670 are provided, and the plurality of post-exposure bake chambers 610 are disposed in the third direction 16 to form different layers. Alternatively, a plurality of post-exposure bake chambers 670 may be provided in each of the first direction 12 and the third direction 16.

When viewed from the top, the carrying chamber 680 is positioned in parallel to the second cooling chamber 540 of the second buffer module 500 in the first direction 12. The carrying chamber 680 has a substantially rectangular shape. A post-treatment robot 682 is positioned in the carrying chamber 680. The post-treatment robot 682 transports the substrate "W" between the cleaning chambers 660, the post-exposure bake chambers 670, the second cooling chamber 540 of the second buffer module 500, and a second buffer 730 of the interface module 700 to be described below. The post-treatment robot 682 provided in the post-treatment module 602 may have the same structure as that of the pre-treatment robot 632 provided in the pre-treatment module 601.

The cleaning chamber 660 cleans the substrate "W" after the exposure process. The cleaning chamber 660 has a housing 661, a support plate 662, and a nozzle 663. The housing 661 has an open-topped cup shape. The support plate 662 is positioned inside the housing 661 and supports the substrate W. The support plate 662 is rotatably provided. The nozzle 663 supplies a cleaning liquid onto the substrate "W" positioned on the support plate 662. The cleaning liquid may be water such as deionized water. The cleaning chamber 660 supplies a cleaning liquid to a central area of the substrate "W" while rotating the substrate "W" positioned on the support plate 662. Alternatively, the nozzle 663 may be linearly moved or rotated from a central area to an edge area of the substrate "W" while the substrate "W" is rotated.

After the exposure process, the bake chamber 670 heats the substrate W, on which the exposure process has been performed, by using a far infrared ray. After the exposure process, in the bake process, the substrate "W" is heated to finish a property change of the photoresist by amplifying acid produced in the photoresist through the exposure process. After the exposure process, the bake chamber 670 has a heating plate 672. The heating plate 672 includes a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Selectively, a bake chamber having only a cooling plate 671 may be further provided.

As described above, the pre/post-exposure module 600 is provided such that the pre-treatment module 601 and the post-treatment module 602 are completely separated from each other The carrying chamber 630 of the pre-treatment module 601 and the carrying chamber 680 of the post-treatment module 602 may have the same size, and may completely overlap each other when viewed from the top. The protective film coating chamber 610 and the cleaning chamber 660 may have the same size, and may completely overlap with each other when viewed from the top. The bake chamber 620 and the post-exposure chamber 670 may have the same size, and may completely overlap with each other when viewed from the top.

The interface module 700 supplies the substrate "W" between the pre/post-exposure module 600 and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is placed at a height corresponding to the pre-treatment module 601, and the second buffer 730 is placed at a height corresponding to the post-treatment module 602. When viewed from the top, the first buffer 720 is arranged in the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate "W" between the first buffer 720, the second buffer 730, and the exposure apparatus 900. The interface robot 740 has a structure that is substantially similar to that of the second buffer robot 560.

The first buffer 720 temporarily stores the substrates "W" subject to the process in the pre-treatment module 601 before the substrates "W" are moved to the exposure apparatus 900. The second buffer 730 temporarily stores the substrates "W" subject to the process in the exposure apparatus 900 before the substrates "W" are moved to the post-treatment module 602. The first buffer 720 has a housing 721 and a plurality of supports 722. The supports 722 are arranged within the housing 721, and are spaced apart from each other in the third direction 16. One substrate "W" is placed on each of the supports 722 The housing 721 has openings (not illustrated) on a side on which the interface robot 740 is provided and on a side on which the pre-treatment robot 721 is provided such that the interface robot 740 and the pre-treatment robot 632 introduce or withdraw a substrate "W" into or out of the cooling plate 722. The second buffer 730 has a structure that is substantially similar to that of the first buffer 720. Meanwhile, the housing 731 of the second buffer 730 has openings in the direction that the interface robot 740 is provided and the direction that the post-treatment robot 682 is provided. The interface module may include only buffers and a robot as described above without a chamber performing a specific process with respect to a substrate.

As described above, according to an embodiment of the inventive concept, mutually different treatment liquids may be supplied in one device. Accordingly, the treatment liquids are selectively supplied depending on films formed on the substrate, thereby easily coping with the substrate having various types of films.

According to an embodiment of the inventive concept, mutually different two or more treatment liquids may be discharged from one nozzle unit in a stream manner and a liquid curtain manner. Accordingly, the efficiency of the space having the nozzle unit may be improved.

According to an embodiment of the inventive concept, the discharge ports for the stream manner are formed in the main body and discharge ports for the liquid curtain manner are provided in both sides of the main body while being inclined in a direction facing the main body. Accordingly, a plurality of liquids may be discharged to the same point.

In addition, according to an embodiment of the inventive concept, the treatment liquids are discharged in an inclination direction of facing the downstream side of the rotation direction of the substrate. Accordingly, the scattering of the treatment liquid may be minimized between the discharged treatment liquid and the rotating substrate.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An apparatus for performing liquid treatment with respect to a substrate, the apparatus comprising:
    a substrate supporting unit configured to support and rotate the substrate; and
    a liquid supplying unit configured to supply a liquid onto the substrate supported by the substrate supporting unit,
    wherein the liquid supplying unit includes:
    a nozzle unit configured to supply at least a first treatment liquid; and
    a moving unit configured to move the nozzle unit,
    wherein the nozzle unit has a first slit discharge port configured to discharge the first treatment liquid in a liquid curtain manner; a second slit discharge port configured to discharge a second treatment liquid in the liquid curtain manner, and a wetting liquid discharge port configured to a pre-wetting liquid, and
    wherein the first slit discharge port and the second slit discharge port are inclined downward in directions of facing each other.

2. The apparatus of claim 1, wherein each of the first slit discharge port and the second slit discharge port are provided to have length directions parallel to a first direction.

3. The apparatus of claim 2, wherein the nozzle unit includes:
    a main body having the wetting liquid discharge port;
    a first body coupled to one side of the main body and having the first slit discharge port; and
    a second body coupled to another side of the main body and having the second slit discharge port, and
    wherein the first body, the main body, and the second body are sequentially arranged in a second direction perpendicular to the first direction.

4. The apparatus of claim 3, wherein the first slit discharge port and the second slit discharge port are provided to be inclined downward in a direction of facing the main body.

5. The apparatus of claim 3, wherein the first slit discharge port and the second slit discharge port are offset from each other about a line passing through the wetting liquid discharge port while extending in the second direction.

6. The apparatus of claim 5, wherein the main body further has a first circular discharge port configured to discharge the first treatment liquid in a steam manner and a second circular discharge port configured to discharge the second treatment liquid in a stream manner,
    wherein the first circular discharge port, the wetting liquid discharge port, and the second circular discharge port are sequentially arranged in the first direction,
    wherein the first slit discharge port is facing the first circular discharge port in the second direction, and
    wherein the second slit discharge port is facing the second circular discharge port in the second direction.

7. A liquid treatment method with respect to a substrate by using the apparatus of claim 6, the method comprising:
    performing a first liquid treatment process of supplying the first treatment liquid onto a first substrate placed on the substrate support unit; and
    performing a second liquid treatment process of supplying the second treatment liquid onto a second substrate placed on the substrate support unit,
    wherein a moving direction of the first slit discharge port in the first liquid treatment process is opposite to a moving direction of the second slit discharge port in the second liquid treatment process.

8. The liquid treatment method of claim 7, wherein the first liquid treatment process includes:

supplying the first treatment liquid, which is discharged in the stream manner, to the center of the first substrate; and supplying the first treatment liquid discharged in the liquid curtain manner to a first discharge region, wherein the second liquid treatment process includes:

supplying the second treatment liquid, which is discharged in the stream manner, to the center of the second substrate, and supplying the second treatment liquid, which is discharged in the liquid curtain manner, to a second discharge region, wherein the first discharge region is moved from central region of respective the first substrate to edge regions of the first substrate, and wherein the second discharge region is moved from central region of the second substrate to edge region of the second substrate.

9. The liquid treatment method of claim 8, wherein the first discharge region includes a region between the central region of a substrate and the edge region of the substrate, and wherein the second discharge region includes a region opposite to the first discharge region about the center of a substrate.

10. The liquid treatment method of claim 7, wherein the first treatment liquid and the second treatment liquid include mutually different types of developing solutions.

11. The apparatus of claim 3, wherein the apparatus further comprises:

a controller configured to control the liquid supplying unit such that the nozzle unit moves in the first direction, and wherein the controller moves the nozzle unit between the central region of the substrate and an edge region of the substrate, based on a position in which a discharge region of the liquid overlaps with a line, which passes through the center of the substrate while extending in the first direction, when viewed from a top.

12. The apparatus of claim 11, wherein a discharging direction of the first treatment liquid and a discharging direction of the second treatment liquid face a downstream side of a rotation direction of the substrate, when viewed from the top.

13. The apparatus of claim 12, wherein the controller is configured to control the liquid supplying unit such that a line passing through the center of the substrate while extending in the second direction is between a first discharge region of the first treatment liquid and a second discharge region of the second treatment liquid, when viewed from the top.

14. A unit for supplying a liquid onto a substrate, the unit comprising:

a nozzle unit configured to supply a first treatment liquid and a second treatment liquid; and a moving unit configured to move the nozzle unit, wherein the nozzle unit has a first slit discharge port configured to discharge the first treatment liquid in a liquid curtain manner; a second slit discharge port configured to discharge the second treatment liquid in the liquid curtain manner; and a wetting liquid discharge port configured to discharge a pre-wetting liquid, and wherein the first slit discharge port and a second slit discharge port configured to discharge a second treatment liquid in the liquid curtain manner are inclined downward in directions of facing each other.

15. The unit of claim 14, wherein the nozzle unit includes:

a main body having the wetting liquid discharge port;

a first body coupled to the main body and having the first slit discharge port; and a second body coupled to the main body and having the second slit discharge port, and wherein each of the first slit discharge port and the second slit discharge port have length directions parallel to a first direction.

16. The unit of claim 15, wherein the first slit discharge port and the second slit discharge port face in a downward-inclined direction such that lower portions of the first slit discharge port and the second slit discharge port are closer to the main body.

17. The unit of claim 16, wherein the first body is coupled to one side of the main body, wherein the second body is coupled to another side of the main body, wherein the one side of the main body and the another side of the main body are opposite sides along a second direction perpendicular to the first direction, and wherein the first slit discharge port and the second slit discharge port are offset from each other about a line passing through the wetting liquid discharge port while extending in the second direction.

18. The unit of claim 15, wherein the main body further comprises, a first circular discharge port configured to discharge the first treatment liquid in a steam manner and a second circular discharge port for discharging the second treatment liquid in a stream manner, wherein the first circular discharge port, the wetting liquid discharge port, and the second circular discharge port are sequentially arranged in the first direction, and wherein the first slit discharge port is facing the first circular discharge port in a second direction, and wherein the second slit discharge port is facing the second circular discharge port in the second direction.

* * * * *